(12) United States Patent
Yamamoto et al.

(10) Patent No.: US 8,497,834 B2
(45) Date of Patent: Jul. 30, 2013

(54) SIGNAL OUTPUT CIRCUIT, SHIFT REGISTER, OUTPUT SIGNAL GENERATING METHOD, DISPLAY DEVICE DRIVING CIRCUIT, AND DISPLAY DEVICE

(71) Applicants: Etsuo Yamamoto, Osaka (JP); Yuhichiroh Murakami, Osaka (JP); Eiji Matsuda, Osaka (JP)

(72) Inventors: Etsuo Yamamoto, Osaka (JP); Yuhichiroh Murakami, Osaka (JP); Eiji Matsuda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/674,541

(22) Filed: Nov. 12, 2012

(65) Prior Publication Data

US 2013/0069920 A1 Mar. 21, 2013

Related U.S. Application Data

(62) Division of application No. 11/922,345, filed as application No. PCT/JP2006/313992 on Jul. 13, 2006, now Pat. No. 8,344,988.

(30) Foreign Application Priority Data

Jul. 15, 2005 (JP) ................................ 2005-207772

(51) Int. Cl.
*G09G 3/36* (2006.01)
*G09G 5/00* (2006.01)
*G06F 3/038* (2006.01)

(52) U.S. Cl.
USPC ............... 345/100; 345/204; 377/64; 377/70; 377/72; 377/73

(58) Field of Classification Search
USPC ................. 345/1.1–111, 156–184, 204–215, 345/690–699; 377/64–81
See application file for complete search history.

(56) References Cited

U.S. PATENT DOCUMENTS 3,828,258 A 8/1974 Hills et al.
3,978,413 A * 8/1976 Frohwerk ........................ 377/72
(Continued)

FOREIGN PATENT DOCUMENTS

CN  1648972  8/2005
JP  2000-339984  12/2000
(Continued)

OTHER PUBLICATIONS

Office Action for corresponding U.S. Appl. No. 11/922,345 dated Oct. 27, 2011.

(Continued)

*Primary Examiner* — Lun-Yi Lao
*Assistant Examiner* — Gene W Lee
(74) *Attorney, Agent, or Firm* — Harness, Dickey & Pierce

(57) ABSTRACT

A signal output circuit of the present invention is provided in a unit stage of a shift register. The signal output circuit includes a set-reset flip-flop, and a signal generation circuit for generating an output signal by loading or blocking a clock signal in accordance with a signal inputted thereto. The signal output circuit is arranged such that: the signal generation circuit receives a signal outputted from the flip-flop and the output signal fed back to the signal generating circuit; and the output signal is fed back to a reset input of the flip-flop. This makes it possible to achieve a reduction in the area of the circuit and a simplification of the circuit.

14 Claims, 19 Drawing Sheets

U.S. PATENT DOCUMENTS

| | | | |
|---|---|---|---|
| 3,988,601 A | 10/1976 | Perry | |
| 4,441,198 A | 4/1984 | Shibata et al. | |
| 4,558,673 A | 12/1985 | Mackie | |
| 4,780,896 A | 10/1988 | Dotter | |
| 4,870,621 A | 9/1989 | Nakada | |
| 5,053,647 A | 10/1991 | Shizukuishi | |
| 5,526,390 A | 6/1996 | Fucili | |
| 5,805,197 A | 9/1998 | Fleming et al. | |
| 5,859,657 A | 1/1999 | Donahue et al. | |
| 5,926,201 A | 7/1999 | Fleming et al. | |
| 6,490,332 B1 | 12/2002 | Somayajula | |
| 6,559,824 B1 | 5/2003 | Kubota et al. | |
| 6,724,361 B1 | 4/2004 | Washio et al. | |
| 6,813,331 B1 | 11/2004 | Yu et al. | |
| 6,909,417 B2* | 6/2005 | Washio et al. | 345/98 |
| 7,145,545 B2* | 12/2006 | Zebedee et al. | 345/100 |
| 7,212,184 B2 | 5/2007 | Washio et al. | |
| 7,659,877 B2 | 2/2010 | Murakami et al. | |
| 8,098,224 B2* | 1/2012 | Washio et al. | 345/100 |
| 2001/0043496 A1 | 11/2001 | Cairns et al. | |
| 2002/0075249 A1* | 6/2002 | Kubota et al. | 345/204 |
| 2003/0030616 A1 | 2/2003 | Maeda et al. | |
| 2003/0174115 A1 | 9/2003 | Washio et al. | |
| 2003/0179174 A1* | 9/2003 | Matsuda et al. | 345/100 |
| 2003/0184512 A1 | 10/2003 | Hayashi et al. | |
| 2003/0234761 A1 | 12/2003 | Washio et al. | |
| 2004/0108989 A1* | 6/2004 | Gyouten et al. | 345/100 |
| 2004/0150610 A1 | 8/2004 | Zebedee et al. | |
| 2004/0174334 A1 | 9/2004 | Washio et al. | |
| 2005/0134352 A1 | 6/2005 | Yokoyama et al. | |
| 2005/0175138 A1 | 8/2005 | Matsuda et al. | |
| 2005/0184784 A1 | 8/2005 | Washio et al. | |

FOREIGN PATENT DOCUMENTS

| | | |
|---|---|---|
| JP | 2001-135093 | 5/2001 |
| JP | 2001-307495 | 11/2001 |
| JP | 2001-318659 | 11/2001 |
| JP | 2001-356728 | 12/2001 |
| JP | 2004-54235 | 2/2004 |
| JP | 2004-185787 | 7/2004 |
| JP | 2004-227751 | 8/2004 |
| JP | 2004-362745 | 12/2004 |
| JP | 2005-192201 | 7/2005 |
| JP | 2005-222655 | 8/2005 |

OTHER PUBLICATIONS

Office Action for corresponding U.S. Appl. No. 11/922,345 dated Apr. 12, 2011.

Office Action for corresponding U.S. Appl. No. 11/922,345 dated Feb. 22, 2012.

Notice of Allowance for corresponding U.S. Appl. No. 11/922,345 dated Aug. 21, 2012.

* cited by examiner

F I G. 1
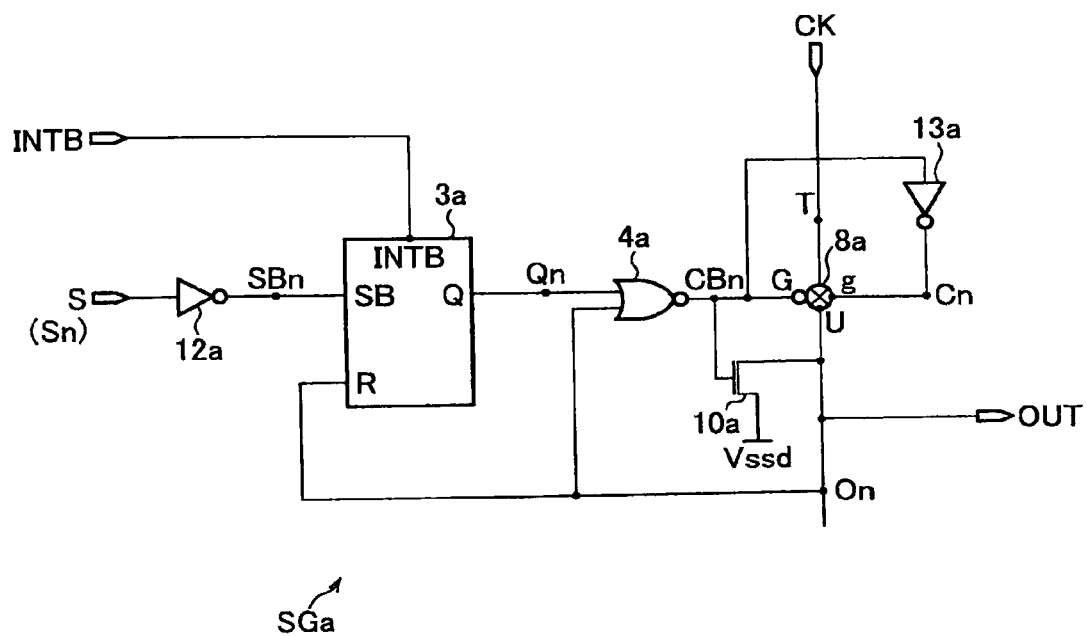

F I G. 5
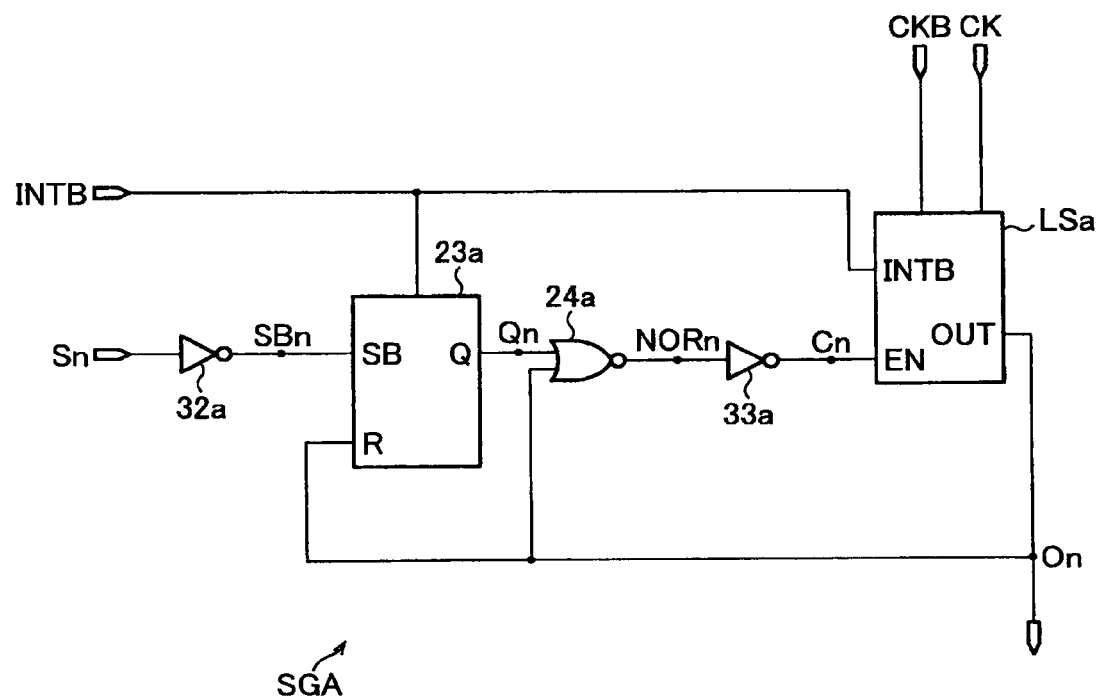

F I G. 2 0
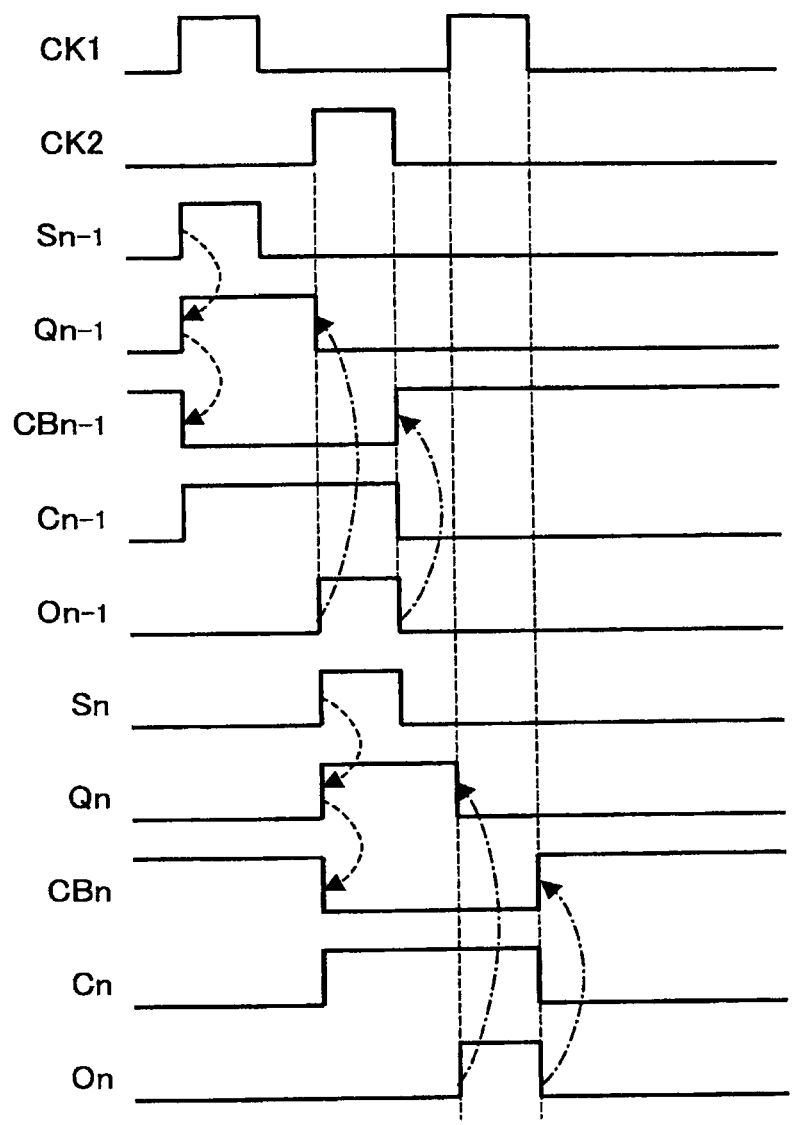

SIGNAL OUTPUT CIRCUIT, SHIFT REGISTER, OUTPUT SIGNAL GENERATING METHOD, DISPLAY DEVICE DRIVING CIRCUIT, AND DISPLAY DEVICE

TECHNICAL FIELD

The present invention relates to a shift register that is provided in a circuit for driving a display device (e.g., a liquid crystal display device).

BACKGROUND ART

FIG. 13 shows an arrangement of a single block (unit stage) of a conventional shift register.

As shown in FIG. 13, the single block SRn of the shift register includes an RS flip-flop (hereinafter referred to as "RF-FF") 103a, two selection circuits 105a and 106a, an analog switch (hereinafter referred to as "ASW") 108a, an N-channel MOS transistor 110a, and two inverters 112a and 113a. The LR line is supplied with a shift direction signal, and the LRB line is supplied with an inversion signal obtained by inverting the shift direction signal. The CK1 line is supplied with a first clock signal, and the CK2 is supplied with a second clock signal.

The selection circuit 105a is arranged so as to include two analog switches ASW, and includes four input terminals p, q, i, and j and an output terminal X. When the input terminals p and q are supplied with a high input and a low input, respectively, the input terminal i and the output terminal X are connected to each other, so that a signal that is inputted to the input terminal i is outputted from the output terminal X. On the other hand, when the input terminals p and q are supplied with a low input and a high input, respectively, the input terminal j and the output terminal X are connected to each other, so that a signal that is inputted to the input terminal j is outputted from the output terminal X. Similarly, the selection circuit 106a includes four input terminals p, q, i, and j, and an output terminal Y. When the input terminals p and q are supplied with a high input and a low input, respectively, the input terminal i and the output terminal Y are connected to each other, so that a signal that is inputted to the input terminal i is outputted from the output terminal Y. On the other hand, when the input terminals p and q are supplied with a low input and a high input, respectively, the input terminal j and the output terminal Y are connected to each other, so that a signal that is inputted to the input terminal j is outputted from the output terminal Y.

The ASW 108a is constituted by a P-channel transistor and an N-channel transistor, and includes two control terminals g and G and two conductive terminals T and U. When the control terminals g is supplied with a high input or the control terminal G is supplied with a low input, the two conductive terminals T and U are connected to each other. When a gate of the N-channel MOS transistor 110a is supplied with a high input, electricity is conducted between its source and drain.

It should be noted here that the input terminal i of the selection circuit 105a and the input terminal j of the selection circuit 106a, and a node Cn−1 (output of the left block) are connected to one another, and that the input terminal j of the selection circuit 105a and the input terminal i of the selection circuit 106a, and a node Cn+1 (output of the right block) are connected to one another. Further, the input terminals p and q of the selection circuit 105a are connected to the LR line and the LRB line, respectively. Similarly, the input terminals p and q of the selection circuit 106a are connected to the LR line and the LRB line, respectively.

Further, the output terminal X of the selection circuit 105a is connected to a set bar input (SB) of the RS-FF 103a via the inverter 112a, and the output terminal Y of the selection circuit 106a is connected to a reset (R) of the RS-FF 103a. Further, an output (Q) of the RS-FF 103a, the control terminal g of the ASW 108a, and an input of the inverter 113a are connected to one another. Further, an output of the inverter 113a, the control terminal G of the ASW 108a, and the gate of the MOS transistor 110a are connected to one another. Further, the source of the MOS transistor 110a is connected to Vssd (low potential); the drain of the MOS transistor 110a, a node Cn (output of the present block), and the conductive terminal U of the ASW 108a are connected to one another. The conductive terminal T of the ASW 108a is connected to the CK2 line. The RS-FF 103a has INTB that is supplied with an initial bar (INTB) signal, by which the output Q is initialized. For example, a low INTB signal causes the output Q of the RS-FF 103a to be initialized to low.

Basic operation (from t1 at which the output of the left block becomes high to t4 at which the output of the right block becomes low) of the single block SRn of the shift register will be described below with reference to a flow chart of FIG. 15. During this period, the LR line and the LRB line are supplied with a high shift direction signal and a low shift direction signal, respectively, so that a rightward shift is made. That is, a shift is made from the left block SRn−1 to the right block SRn+1 through the present block SRn.

First, since the LR line is high and the LRB line is low, the input terminals p and q of the selection circuit 105a are supplied with a high input and a low input, respectively, so that a signal that is inputted to the input terminal i is outputted from the output terminal X (=node Sn). Similarly, the input terminals p and q of the selection circuit 106a are supplied with a high input and a low input, respectively, so that a signal that is inputted to the input terminal i is outputted from the output terminal Y (=node Rn).

At t1 where the node Cn−1 receives a high output signal from the left block SRn−1, the output terminal X of the selection circuit 105a becomes high. At this time, the node Cn+1 is low, so that the output terminal Y of the selection circuit 106a remains low. Since the output terminal X is high and the output terminal Y is low, the SB and R (reset) of the RS-FF 103a are each supplied with a low input, so that the output Q of the RS-FF 103a becomes high. With this, whereas the ASW 108a is turned on (the control terminal g becomes high and the control terminal G becomes low), the MOS transistor 110a is turned off. Therefore, the node Cn is supplied with a low output signal from the CK2 line via the conductive terminals T and U of the ASW 108a. When the CK2 line becomes high afterward (between t1 and t2), the node Cn is also supplied with a high output.

Then, at t2 where the output signal from the left block SRn−1 becomes low and the node Cn−1 receives the low output signal, the output terminal X of the selection circuit 105a becomes low. At this time, the node Cn+1 remains low, so that the output terminal Y of the selection circuit 106a also remains low. Since the output terminals X and Y are low, the SB and R (reset) of the RS-FF 103a are supplied with a high input and a low input, respectively, so that the output Q of the RS-FF 103a remains as high as currently is. Therefore, the ASW 108a remains turned on and the conductive terminals T and U are connected to each other, so that the high output signal supplied from the CK2 line at t2 is outputted to the node Cn.

Then, at t3 where the output signal from the right block SRn+1 becomes high and the node Cn+1 receives with the high output signal, the output terminal Y of the selection circuit 106a becomes high. At this time, the node Cn−1 (output of the left block SRn−1) remains low, so that the output terminal X of the selection circuit 105a also remains low. Since the output terminal X remains low and the output terminal Y becomes high, the SB of the RS-FF 103a remains high and the R (reset) of the RS-FF 103a is supplied with a high input, so that the output Q of the RS-FF 103a becomes low. With this, the ASW 108a is turned off (the control terminal g becomes low and the control terminal G becomes high), so that the conductive terminals T and U are disconnected from each other. At this time, the inverter 113a causes the gate of the N-channel MOS transistor 110a to be high, so that electricity is conducted between the source and drain of the MOS transistor 110a. With this, the node Cn is supplied with Vssd (low output signal).

Then, at t4 where the output signal from the right block SRn+1 becomes low and the node Cn+1 receives the low output signal, the output terminal Y of the selection circuit 106a becomes low. At this time, the node Cn−1 (output of the left block SRn−1) remains low, so that the output terminal X of the selection circuit 105a also remains low. Since the output terminal X remains low and the output terminal Y becomes low, the SB of the RS-FF 103a remains low and the R (reset) of the SR-FF 103a is supplied with a low input, so that the output Q of the RS-FF 103a remains high. Therefore, the ASW 108a remains turned off. The conductive terminals T and U remain disconnected from each other. The MOS transistor 110a remains turned on. The node Cn continues to be supplied with Vssd (low output signal).

An arrangement of the whole shift register will be described below by using FIG. 14 with reference to the arrangement of each of the blocks. It should be noted that the shift register can switch between a rightward shift and a leftward shift.

As shown in FIG. 14, the shift register 101 includes blocks 1 through SRn−1, SRn, and SRd (dummy block).

The block SRn includes an RS flip-flop (hereinafter referred to as "RS-FF") 103a, two selection circuits 105a and 106a, an analog switch (hereinafter referred to as "ASW") 108a, an N-channel MOS transistor 110a, two inverters 112a and 113a, and a DELAY circuit. Similarly, the block SRn−1 includes an RS flip-flop (hereinafter referred to as "RS-FF") 103b, two selection circuits 105b and 106b, an analog switch (hereinafter referred to as "ASW") 108b, an N-channel MOS transistor 110b, and two inverters 112b and 113b. Similarly, the block SRd (dummy block) includes an RS flip-flop (hereinafter referred to as "RS-FF") 103d, two selection circuits 105d and 106d, an analog switch (hereinafter referred to as "ASW") 108d, an N-channel MOS transistor 110d, and two inverters 112d and 113d.

The RS-FFs (103a, 103b, 103d) are arranged in the same manner. The selection circuits (105a, 106a, 105b, 106b, 105d, 106d) are arranged in the same manner. The analog switches ASW (108a, 108b, 108d) are arranged in the same manner. The N-channel MOS transistors (110a, 110b, 110d) are arranged in the same manner. The inverters (112a, 113a, 112b, 113b, 112d, 113d) are arranged in the same manner. Furthermore, each of those blocks (SRn−1, SRn, SRd) which constitute the shift register is basically arranged in the same manner as the single block (SRn) of the shift register of FIG. 13, except for the way the input terminals i and j of the selection circuits are connected and the way the CK1 and CK2 lines are connected. In view of this, the following describes the way the blocks are connected to one another, as well as the way the input terminals i and j of the selection circuits are connected and the way the CK1 and CK2 lines are connected.

An input terminal i of the selection circuit 105b of the block SRn−1, an input terminal j of the selection circuit 106b, and an output Cn−2 (output of a block provided on the left side of the block SRn−1) are connected to one another, and an input terminal j of the selection circuit 105b, an input terminal i of the selection circuit 106b, and an output Cn of the block SRn are connected to one another. Further, the ASW 108a has a conductive terminal T connected to the CK2 line. An input terminal i of the selection circuit 105a of the block SRn, an input terminal j of the selection circuit 106a, and an output Cn−1 of the block SRn−1 are connected to one another. Further, the selection circuit 105a has an input terminal j connected to the SP line via a start pulse switch SW117, and the selection circuit 106a has an input terminal i connected to an output Cd of the block SRd. Further, the ASW 108a has a conductive terminal T connected to the CK1 line. The selection circuit 105d of the block SRd has an input terminal i connected to the output Cn of the block SRn, and has an input terminal j connected to Vssd (low potential). The selection circuit 106d has an input terminal j connected to Vdd (high potential). The selection circuit 106d has an input terminal i connected to an R (reset) of the RS-FF 103a of the block SRn via the DELAY circuit. Further, the ASW 108d has a conductive terminal T connected to the CK2 line.

The LR line is supplied with a shift direction signal. The LRB line is supplied with an inversion signal obtained by inverting the shift direction signal. The SP line is supplied with a start pulse signal. The CK1 line is supplied with a first clock signal. The CK2 line is supplied with a second clock signal. The INT line is supplied with an INT signal (for initializing each of the RS-FFs).

Operation of the whole shift register will be described below by using timing charts of FIGS. 16 and 17 with reference to the above-described arrangement of the shift register and the above-described operation of each of the blocks.

Although not shown in FIGS. 16 and 17, the initial reset is performed regardless of the shift direction. That is, when the INT line is supplied with a high INT signal, an INTB of each of the RS-FFs are supplied with a low input, so that the respective outputs (Qn−1, Qn, and Qd) of the RS-FF 103 (103a, 103b, and 103d) become low. At this time, the respective control terminals g of the ASWs 108 become low, so that the conductive terminals T and U of each of the ASWs are disconnected from each other. Therefore, each of the MOS transistors 110 is turned on, so that each of the outputs (Cn−1, Cn, and Cd) is supplied with Vssd (low output signal). After that, the INT signal is set back to low.

Described first is a case where a leftward shift is made by supplying the LR line and the LRB line with a low shift direction signal and a high shift direction signal, respectively (i.e., a case where a shift is made from the block SRn to the block SRn−1). Such a shift will be described below with reference to the timing chart of FIG. 16.

First, since the LR line is low and the LRB line is high, the input terminals p and q of the selection circuit 105a are supplied with a low input and a high input, respectively, so that a signal that is inputted to the input terminal j is outputted from the output terminal X. Similarly, the input terminals p and q of the selection circuit 106a are also supplied with a low input and a high input, respectively, so that a signal that is inputted to the input terminal j is outputted from the output terminal Y. Further, since the LR line is low and the LRB line is high, the SW 117 is on and the SW 118 is off.

At t1 where the SP line is supplied with a high start pulse signal, the start pulse signal is supplied to the block SRn via the SW 117, so that the input terminal j of the selection circuit 105a becomes high. With this, the X (Sn) of the block SRn becomes high. Since the output Cn−1 of the block SRn−1 (input terminal j of the selection circuit 106a) is low due to the initialization, the Y of the block SRn also becomes low. Since the X of the block SRn is high and the Y of the block SRn is low, the SB and reset R (Rn) of the RS-FF 103a are each supplied with a low input, so that the output Q (Qn) of the RS-FF 103a becomes high. With this, whereas the ASW 108a is turned on (the control terminal g becomes high and the control terminal G becomes low), the MOS transistor 110a is turned off. Therefore, the output Cn is supplied with a low output signal from the CK1 line via the conductive terminals T and U of the SW 108a.

At t2 where the start pulse signal becomes low, the input terminal j of the selection circuit 105a becomes low, so that the X and Y of the block SRn become low. That is, the SB and R (reset) of the RS-FF 103a are supplied with a high input and a low input, respectively, so that the output Q of the RS-FF 103a remains as high as currently is. Therefore, the output Cn continues to be supplied with the low output signal from the CK1 line.

Then, at t3 where the (clock) signal CK1 from the CK1 line becomes high, the output Cn becomes high. With this, the input terminal j of the selection circuit 105b of the block SRn−1 becomes high. At this time, the input terminal j (output of the left block SRn−2) of the selection circuit 106b of the block SRn−1 is low due to the initialization. Therefore, the X (Sn−1) of the block SRn−1 becomes high and the Y of the block SRn−1 becomes low. The SB and reset R (Rn−1) of the RS-FF 103b are each supplied with a low input, so that the output Q (Qn−1) of the RS-FF 103b becomes high. With this, the ASW 108b is turned on, so that the output Cn−1 is supplied with a low output signal from the CK2 line.

Then, at t4 where the (clock) signal CK1 from the CK1 line becomes low, the output Cn becomes low. With this, the input terminal j of the selection circuit 105b of the block SRn−1 becomes low. Since the input terminal j of the selection circuit 106b remains low, the X (Sn−1) and Y of the block SRn−1 become low. The SB and R (reset) of the RS-FF 103b are supplied with a high input and a low input, respectively, so that the output Q (Qn−1) of the RS-FF 103b remains as high as currently is. Further, since the ASW 108b remains turned on, the output Cn−1 continues to be supplied with the low output signal from the CK2 line.

Then, at t5 where the (clock) signal CK2 from the CK2 line becomes high, the output Cn−1 becomes high. With this, the input terminal j of the selection circuit 106a of the block SRn becomes high. Since the input terminal j of the selection circuit 105a remains low, the X (Sn) of the block SRn is low and the Y of the block SRn is high. The SB and reset R (Rn) of the RS-FF 103a are each supplied with a high input, so that the output Q (Qn) of the RS-FF 103a becomes low. With this, the ASW 108a is turned off, so that the conductive terminals T and U are disconnected from each other. Meanwhile, electricity is conducted between the drain and source of the MOS transistor 110a, so that the output Cn is supplied with Vssd (low output signal).

Then, at t6 where the (clock) signal CK2 from the CK2 line is low, the output Cn−1 becomes low. With this, the input terminal j of the selection circuit 106a of the block SRn becomes low. Since the input terminal j of the selection circuit 105a remains low, the X (Sn) the block SRn is low and the Y of the block SRn becomes low. The SB and reset R (Rn) of the RS-FF 103a are supplied with a high input and a low input, respectively, so that the output Q (Qn) of the RS-FF 103a remains low. With this, the ASW 108a is turned off. Meanwhile, electricity is conducted between the source and drain of the MOS transistor 110a, so that the output Cn continues to be supplied with Vssd (low output signal).

Described next is a case where a rightward shift is made by supplying the LR line and the LRB line with a high shift direction signal and a low shift direction signal, respectively (a case where a shift is made from the block SRn−1 to the block SRd through the block SRn). Such a shift will be described below with reference to the timing chart of FIG. 17.

First, since the LR line is high and the LRB line is low, the input terminals p and q of the selection circuit 105a are supplied with a high input and a low input, respectively, so that a signal that is inputted to the input terminal i is outputted from the output terminal X. Similarly, the input terminals p and q of the selection circuit 106a are also supplied with a high input and a low input, respectively, so that a signal that is inputted to the input terminal i is outputted from the output terminal Y. Further, since the LR line is high and the LRB line is low, the SW 117 for a start pulse signal is off and the SW 118 is on.

At t1, the signal CK2 becomes high, so that the output Cn−1 of the block SRn−1 becomes high. Then, the input terminal i of the selection circuit 105a and the X (Sn) of the block SRn become high, and the input terminal i and Y of the selection circuit 106a become low. With this, the SB and reset R (Rn) of the RS-FF 103a are each supplied with a low input, so that the output Q (Qn) of the RS-FF 103a becomes high. At this time, the ASW 108a is turned on, so that the output Cn is supplied with a low output signal from the CK1 line via the conductive terminals T and U.

At t2, the signal CK1 becomes high, so that the output Cn of the block SRn becomes high. Then, the input terminal i of the selection circuit 105d of the block SRd and the X (Sd) of the block SRd become high, and the input terminal i of the selection circuit 106d and the Y of the selection circuit 106a become low. With this, the SB and reset R (Rd) of the RS-FF 103d are each supplied with a low input, so that the output Q (Qd) of the RS-FF 103d becomes high. At this time, the ASW 108d is turned on, so that the output Cd is supplied with a low output signal from the CK2 line via the conductive terminals T and U.

At t3, the signal CK2 becomes high, so that the output Cd of the block SRd becomes high. With this, the input terminal i of the selection circuit 105a of the block SRn and the X (Sn) of the block SRn are low, and the input terminal i of the selection circuit 106d and the Y of the block SRn are high. Therefore, the SB and reset R (Rn) of the RS-FF 103a are each supplied with a high input, so that the output Q of the RS-FF 103a becomes low. At this time, since the ASW 108a is off, the output Cn is supplied with Vssd (low output signal) via the source and drain of the MOS transistor 110a. It should be noted here that: the high output signal from the Y of the selection circuit 106a is delayed by the DELAY circuit, and then is inputted to the input terminal i of the selection circuit 106d at t4.

At t4, the input terminal i of the selection circuit 105d of the block SRd and the X (Sd) of the block SRd become low, and the input terminal i of the selection circuit 106d and the Y of the block SRd become high. With this, the SB and reset R (Rd) of the RS-FF 103d are each supplied with a high input, so that the output Q (Qd) of the RS-FF 103d becomes low. At this time, since the ASW 108d is off, the output Cd is supplied with Vssd (low output signal) via the source and drain of the MOS transistor 110d.

[Patent Document 1] Japanese Unexamined Patent Application Publication No. 135093/2001 (Tokukai 2001-135093; published on May 18, 2001)

[Patent Document 2] Japanese Unexamined Patent Application Publication No. 339984/2000 (Tokukai 2000-339984; published on Dec. 8, 2000)

[Patent Document 3] Japanese Unexamined Patent Application Publication No. 307495/2001 (Tokukai 2001-307495; published on Nov. 2, 2001)

[Patent Document 4] United States Patent Application Publication No. US2003/0184512A1 (published on Oct. 2, 2003)

DISCLOSURE OF INVENTION

However, according to the conventional shift register, a flip-flop of each block is reset (inactivated) with use of an output of another block (another stage) or, more specifically, with use of an output of the subsequent stage (next stage) in the shift direction such that the output Q (Qn−1) of the RS-FF 103b of the block SRn−1 is reset with use of the output Cn of the block SRn and the output Q (Qn) of the RS-FF 103a of the block SRn is reset with use of the output Cd of the block SRd. This makes it necessary to provide a dummy block (dummy stage) such as the block SRd. Further, this lengthens and complicates wires to be provided between one blocks and another. This results in an increase in the area of the circuit (or an increase in the area of a frame of a panel in which the circuit is mounted). In addition, this results in an increase in the likelihood of physical failures such a wiring short and signal defects such as a signal delay. Especially in cases where the shift register is arranged so as to be capable of making shifts in two directions (from right to left and from left to right), it becomes necessary to provide two selection circuits (105a and 106a of FIG. 13) in each block. Moreover, it is very complicating to wire them.

The present invention has been made in view of the foregoing problems, and it is an object of the present invention to provide a signal output circuit for use in a shift register which signal output circuit achieves a reduction in the area of the circuit and a simplification of wiring.

A signal output circuit of the present invention is a signal output circuit that is provided in a unit stage of a shift register, including: a set-reset flip-flop; and a signal generation circuit for generating an output signal by loading or blocking a clock signal in accordance with a signal inputted thereto, the signal generation section receiving a signal outputted from the flip-flop and the output signal fed back from the signal generation circuit, the output signal being fed back to a reset input of the flip-flop.

The signal output circuit of the present invention may be arranged such that: the signal outputted from the flip-flop is a first control signal; and the signal generation circuit generates a second control signal in accordance with the first control signal and the output signal fed back from the signal generation circuit, and loads or blocks the clock signal with use of the second control signal.

With this, for example, the first control signal can be inactivated by activating the output signal, and the second control signal can be inactivated by inactivating the output signal. This makes it possible for each stage to reset the first and second control signals by itself (self-reset) without receiving a reset signal from another stage. Therefore, unlike in the case of the conventional arrangement in which each stage is supplied with a reset signal from another stage, the dummy stage can be eliminated and the number of wires between one stage and another can be significantly reduced. This results in a reduction in the area of the circuit (or a reduction in the area of a frame of a panel in which the circuit is mounted). Furthermore, it is possible to reduce signal defects such as a signal delay as well as physical failures such a wiring short.

The present shift register can be arranged such that the second control signal is activated by inactivating the output signal and activating the first control signal.

The present shift register can be arranged such that the signal generation circuit includes a logic circuit to which the first control signal is inputted, the output signal being fed back to an input of the logic circuit, the logic circuit outputting the second control signal.

The present shift register can be arranged such that the logic circuit is either a NOR circuit or an OR circuit.

The present shift register can be arranged such that the signal generation section includes a switch circuit that loads or blocks the clock signal by the second control signal.

The present shift register can be arranged such that the signal generation section includes a level shifter that loads or blocks the clock signal by the second control signal.

The present shift register can be arranged such that the flip-flop is capable of initializing the first control signal on receipt of an initialization signal so that the first control signal is inactivated. This makes it possible to prevent the flip-flop from being activated at the time of initialization for some reason, thereby surely enabling self-reset.

The present shift register can be arranged such that at the time of initialization, the clock signal has a level corresponding to an inactive level of the output signal. This makes it possible to prevent the output signal from being activated at the time of initialization, thereby enabling self-reset.

The present shift register can be arranged such that at the time of initialization, the logic circuit receives a signal that is based on the initialization signal. For example, when the logic circuit receives a signal that is based on the initialization signal, the second control circuit at the time of initialization serves as a signal for blocking the clock signal. This makes it possible to prevent the output signal from being activated at the time of initialization for some reason, thereby surely enabling self-reset regardless of the level (high or low) of the clock signal.

The present shift register can be arranged such that the signal output circuit is capable of outputting at least either one of the first and second control signals in addition to the output signal. This makes it possible to output plural types of pulse signal such single pulse signals and double pulse signals.

Further, a signal output circuit of the present invention is a signal output circuit that is provided in a unit stage of a shift register, including: a set-reset flip-flop; a logic circuit; and an analog switch, the analog switch having an input terminal connected to a line via which a clock signal is supplied, the logic circuit having a first input terminal connected to an output terminal of the flip-flop and a second input terminal connected to an output terminal of the analog switch, the logic circuit having an output terminal connected to a control terminal of the analog switch, the flip-flop having a reset input terminal connected to the output terminal of the analog switch.

Further, a signal output circuit of the present invention is a signal output circuit that is provided in a unit stage of a shift register, including: a set-reset flip-flop; a logic circuit; and a level shifter, the level shifter has an input terminal connected to a line via which a clock signal is supplied, the logic circuit having a first input terminal connected to an output terminal of the flip-flop and a second input terminal connected to an output terminal of the level shifter, the logic circuit having an output terminal connected to a control terminal of the level shifter, the flip-flop having an input terminal connected to the output terminal of the level shifter.

Further, the signal output circuit of the present invention may be provided in a shift register of a circuit for driving a display device, the display device being driven with use of a signal obtained at at least one of the output terminal of the analog switch, the output terminal of the logic circuit, and the output terminal of the flip-flop.

Further, the signal output circuit of the present invention may be provided in a shift register of a circuit for driving a display device, the display device being driven with use of a signal obtained at at least one of the output terminal of the level shifter, the output terminal of the logic circuit, and the output terminal of the flip-flop.

Further, a shift register of the present invention include such a signal output circuit as described above.

In this case, it is preferable that the signal output circuit be provided in at least either a first stage or a last stage. This eliminates the need for such a dummy stage as provided in the conventional arrangement, thereby making it possible to provide a shift register having a small circuit area (or a small frame area when mounted in a panel). Further, the present signal output circuit may be provided in every stage. This makes it possible to achieve a significant reduction in the number of wires between one stage and another in addition to the foregoing effect. Furthermore, by providing, in each stage, a selection circuit for determining a shift direction, it becomes possible to make shifts in two directions. In this case, the present signal output circuit is capable of resetting itself, so that it is only necessary to provide a single selection circuit in each stage unlike in the case of the conventional arrangement. In addition to this, it is possible to significantly reduce wires provided between one stage and another. This makes it possible to significantly reduce the circuit area of a shift register capable of making shifts in two directions (or to significantly reduce the frame area when the shift register is mounted in a panel).

Further, a display device driving circuit of the present invention includes such a shift register as described above.

Further, a display device of the present invention includes such a display device driving circuit as described above.

An output signal generating method of the present invention is a method for generating an output signal by loading or blocking a clock signal in each stage of a shift register, including the steps of: while feeding back the output signal to a reset input of a set-reset flip-flop, generating a control signal with use of a signal outputted by the flip-flop and the output signal thus fed back; and loading or blocking the clock signal with use of the control signal.

The present output signal generating method can be arranged such that whereas the signal outputted by the flip-flop is inactivated by activating the output signal, the control signal is inactivated by inactivating the output signal.

The present output signal generating method can be arranged such that wherein the control signal is activated by activating, when the output signal is inactive, the signal outputted by the flip-flop.

As described above, in a signal output circuit of the present invention, a signal generation circuit receives a signal outputted from a flip-flop and an output signal fed back to the signal generation circuit, and the output signal is inputted to a reset of the flip-flop. This makes it possible for each stage to reset itself (self-reset) without receiving a reset signal from another stage. Therefore, unlike in the case of the conventional arrangement in which each stage is supplied with a reset signal from another stage, the dummy stage can be eliminated and the number of wires between one stage and another can be significantly reduced. This results in a reduction in the area of the circuit (or a reduction in the area of a frame of a panel in which the circuit is mounted). Furthermore, it is possible to reduce signal defects such as a signal delay as well as physical failures such a wiring short.

BRIEF DESCRIPTION OF DRAWINGS

FIG. 1 is a circuit diagram showing an arrangement of a signal output circuit of the present shift register.

FIG. 5 is a circuit diagram showing an arrangement of a signal output circuit of the present shift register.

FIG. 20 is a timing chart showing operation of two blocks ((n−1)th and nth stages) of the present shift register.

Figure 2:
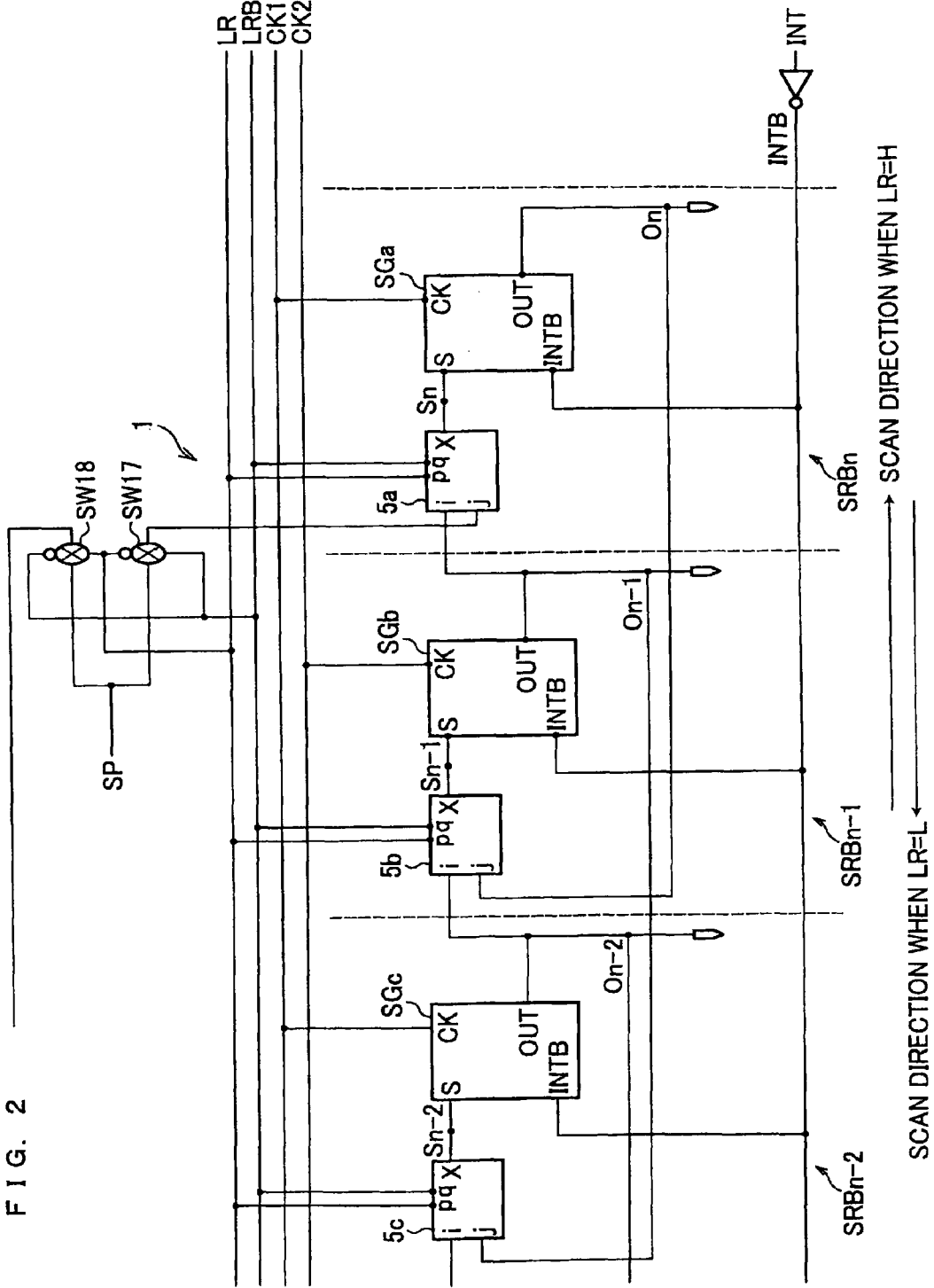
FIG. 2 is a circuit diagram showing an arrangement of the present shift register.

REFERENCE NUMERALS 1, 2 Shift register
3, 23 RS flip-flop
4, 24 NOR circuit
5, 25 Selection circuit
8, 17, 18 Analog switch
10, 21 MOS transistor
12, 13, 32, 33 Inverter
40a Malfunction prevention circuit 43 Phase difference detection section
44 Waveform timing forming section
50 to 56 N-channel MOS transistor
57 to 63 P-channel MOS transistor
SRB Single block of the shift register
LS Level shifter
SG (SGa, SGb, SGA, SGB) Signal output circuit

BEST MODE FOR CARRYING OUT THE
INVENTION

Figure 21:
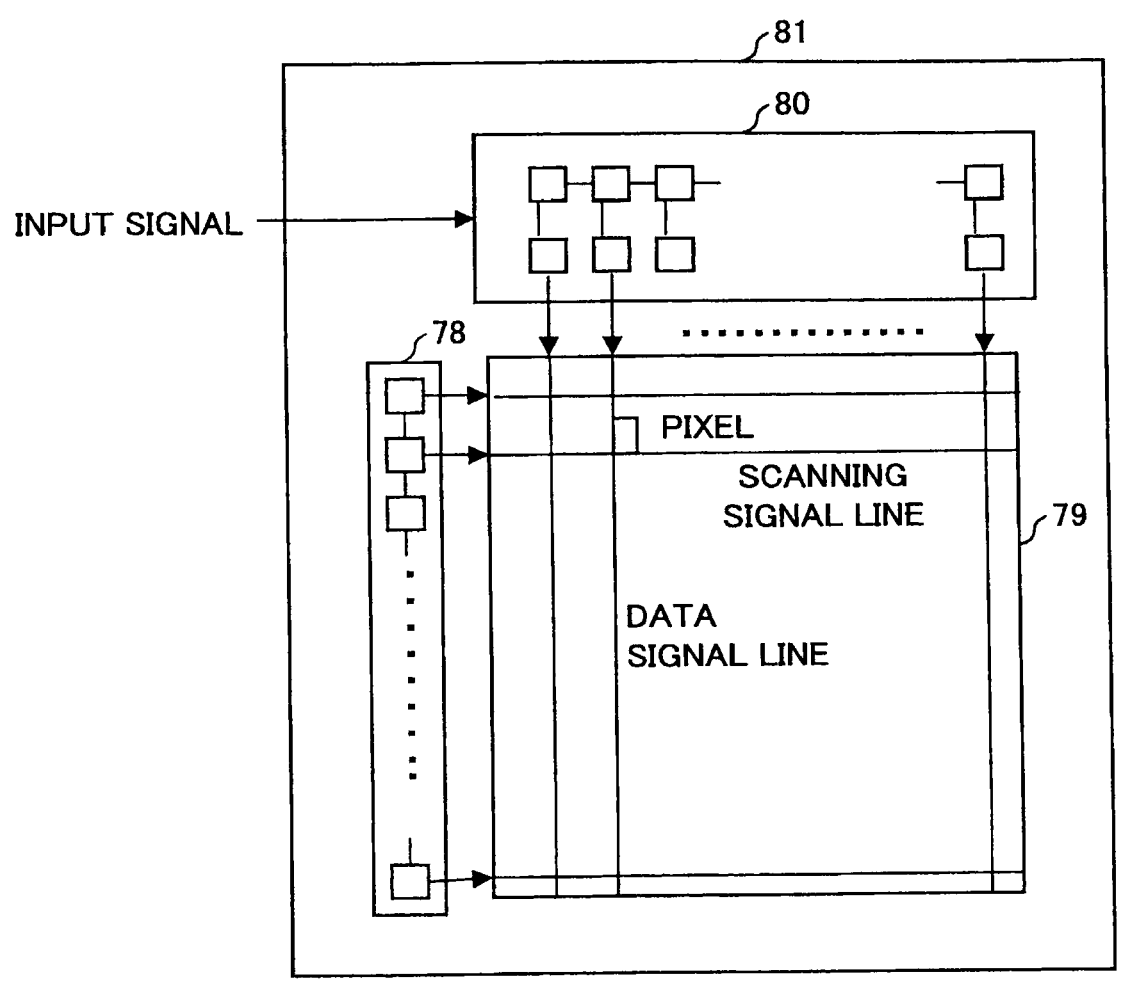
FIG. 21 is a block diagram showing an arrangement of the present liquid crystal display device.

FIG. 21 is a block diagram showing an arrangement of a liquid crystal display device according to the present embodiment. As shown in FIG. 21, the present liquid crystal display device 81 includes a display section 79, a gate driver 78, and a source driver 80. The source driver 80 is supplied with a video signal. Further, the display section 79 has pixels respectively provided near nodes of a plurality of scanning signal lines and a plurality of data signal lines orthogonal to one another.

FIG. 2 shows an arrangement of the present shift register that is provided in the source driver 80. As shown in FIG. 2, the present shift register 1 includes blocks SRB1 through SRBn−2, SRBn−1 and SRBn (unit stages of the shift register), and each of the blocks includes a signal output circuit SG and a selection circuit 5.

The block SRBn has a signal output circuit SGa and a selection circuit 5a, and the signal output circuit SGa includes an RS flip-flop (hereinafter referred to as "RS-FF") 3a, a NOR circuit 4a, an analog switch (hereinafter referred to as "ASW") 8a, an N-channel MOS transistor 10a, and two inverters 12a and 13a. Similarly, the block SRBn−1 has a signal output circuit SGb and a selection circuit 5b, and the signal output circuit SGb includes an RS flip-flop (hereinafter referred to as "RS-FF") 3b, a NOR circuit 4b, an analog switch (hereinafter referred to as "ASW") 8b, an N-channel MOS transistor 10b, and two inverters 12b and 13b (see FIG. 18). Similarly, the block SRBn−2 has a signal output circuit SGc and a selection circuit 5c, and the signal output circuit SGc includes an RS flip-flop (hereinafter referred to as "RS-FF") 3c, a NOR circuit 4c, an analog switch (hereinafter referred to as "ASW") 8c, an N-channel MOS transistor 10c, and two inverters 12c and 13c (see FIG. 19).

The LR line is supplied with a shift direction signal, and the LRB line is supplied with an inversion signal obtained by inverting the shift direction signal. The CK1 line is supplied with a first clock signal, and the CK2 line is supplied with a second clock signal.

Figure 10:
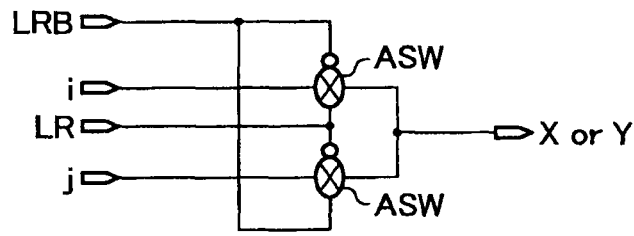
FIG. 10(a) is a circuit diagram showing an arrangement of a selection circuit.
FIG. 10(b) is a circuit diagram showing an arrangement of an analog switch.
Figure 10:
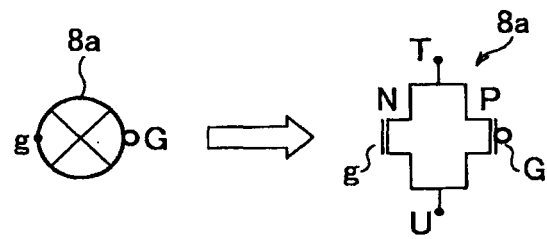
Figure 11:
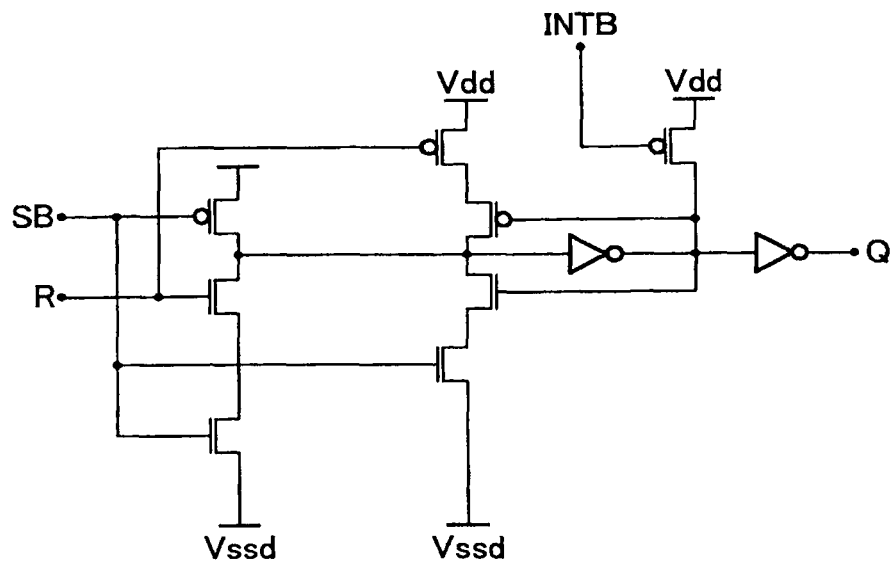
FIG. 11 is a circuit diagram showing an arrangement of an RS flip-flop.

The selection circuits 5 (5a, 5b, 5c) is arranged, for example, as shown in FIG. 10(a). The selection circuit 5 has four input terminals p, q, i, and j and an output terminal X. When the input terminals p and q are supplied with a high input and a low input, respectively, the input terminal i and the output terminal X are connected to each other, so that a signal that is inputted to the input terminal i is outputted from the output terminal X. On the other hand, when the input terminals p and q are supplied with a low input and a high input, respectively, the input terminal j and the output terminal X are connected to each other, so that a signal that is inputted to the input terminal j is outputted from the output terminal X. Further, each of the ASWs 8 (8a, 8b, 8c) is arranged, for example, as shown in FIG. 10(b). The ASW 8 is constituted by a P-channel transistor and an N-channel transistor, and includes two control terminals G and g and two conductive terminals T and U. When the control terminal g is supplied with a high input or the control terminal G is supplied with a low input, the two conductive terminals T and U are connected to each other. When a gate of the N-channel MOS transistor 10a is supplied with a high input, electricity is conducted between its source and drain. Further, each of the RS-FFs (3a, 3b, 3c) is arranged, for example, as shown in FIG. 11.

Each of the inverters 12 (12a, 12b, 12c) and 13 (13a, 13b, 13c) is a circuit that outputs a negative logic signal obtained by amplifying a positive logic signal.

FIG. 1 shows a specific arrangement of the signal output circuit SGa provided in the block SRBn. As shown in FIG. 1, an input S (see FIG. 2) connected to the output terminal X of the selection circuit 5a and an input side of the inverter 12a are connected to each other, and an output of the inverter 12a is inputted to a set bar (SB) of the RS-FF 3a. Further, the RS-FF 3a has an output Q (Qn) connected to one input of the NOR circuit 4a, and the other input of the NOR circuit 4a is connected to a reset input (R) of the RS-FF 3a and a node On (output of the block SRBn). Further, an output (node CBn) of the NOR circuit 4a, the control terminal G of the ASW 8a, an input of the inverter 13a, and the gate of the MOS transistor 10a are connected to one another. Further, an output (node Cn) of the inverter 13a and the control terminal g of the ASW 8a are connected to each other, and the source of the MOS transistor 10a is connected to Vssd (low potential). Furthermore, the conductive terminal U of the ASW 8a, the drain of the MOS transistor 10a, OUT, and the node On (output of the block SRBn) are connected to one another. Thus, the signal generation circuit is constituted by the NOR circuit 4a, the ASW 8a, the MOS transistor 10a, and the like.

Figure 18:
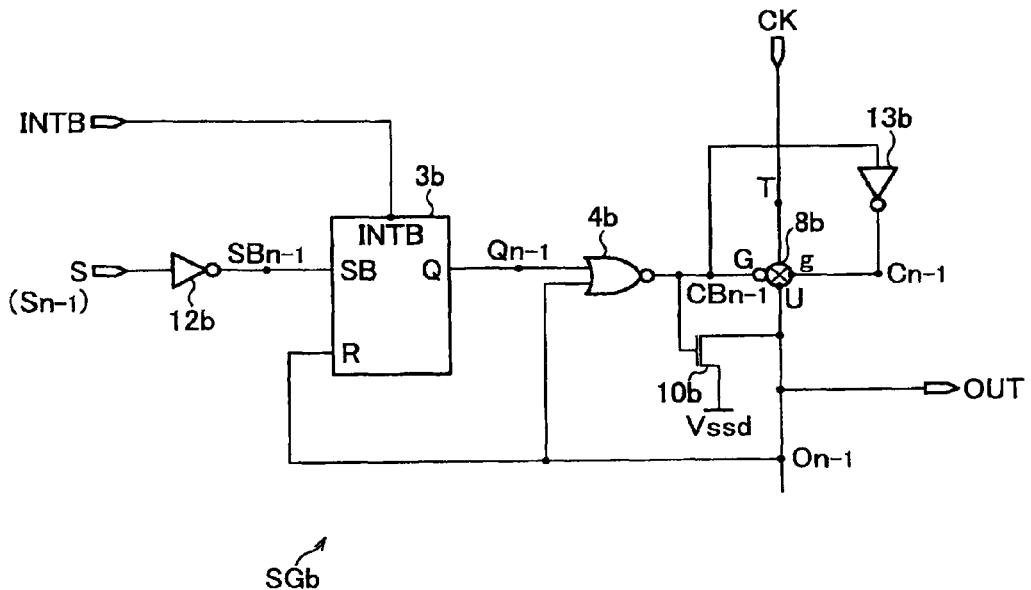
FIG. 18 is a circuit diagram showing an arrangement of a signal output circuit ((n−1)th stage) of the present shift register.
Figure 19:
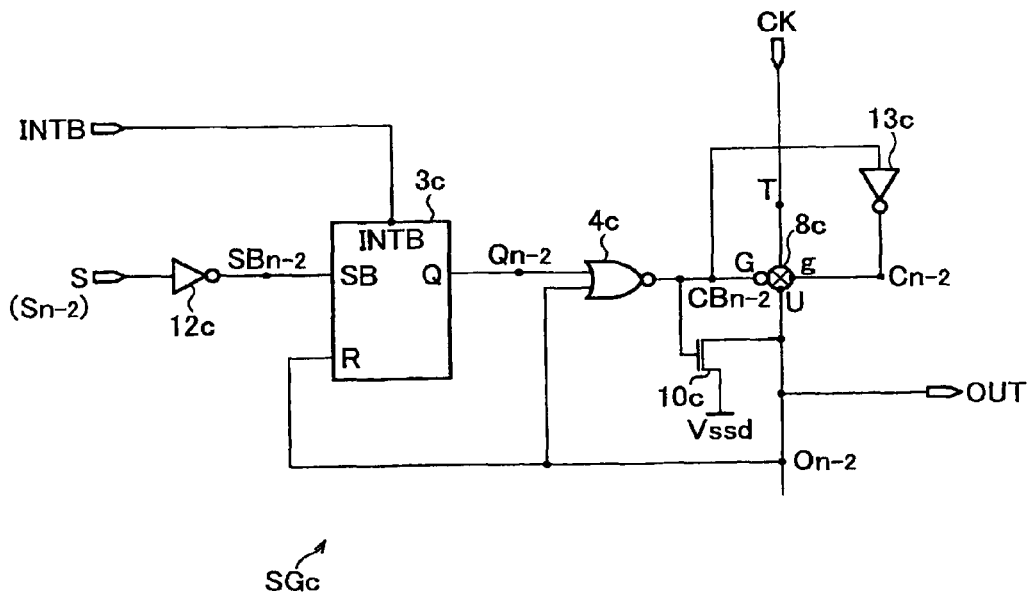
FIG. 19 is a circuit diagram showing an arrangement of a signal output circuit ((n−2)th stage) of the present shift register.

As shown in FIGS. 18 and 19, the signal output circuits SGb and SGc are arranged in the same manner as the signal output circuit SGa. For example, as for the signal output circuit SGb, a node Sn−1 connected to the X terminal of the selection circuit 5b and an input side of the inverter 12b are connected to each other, and an output of the inverter 12b is inputted to a set bar (SB) of the RS-FF 3b. Further, the RS-FF 3b has an output (Qn−1) connected to one input of the NOR circuit 4b, and the other input of the NOR circuit 4b is connected to a reset input (R) of the RS-FF 3b and a node On−1 (output of the block SRBn−1). Further, an output (node CBn−1) of the NOR circuit 4a, the control terminal G of the ASW 8b, an input of the inverter 13b, and the gate of the MOS transistor 10b are connected to one another. Further, an output (node Cn−1) of the inverter 13b and the control terminal g of the ASW 8b are connected to each other, and the source of the MOS transistor 10b is connected to Vssd (low potential). Furthermore, the conductive terminal U of the ASW 8b, the drain of the MOS transistor 10b, and the node On−1 (output of the block SRBn−1) are connected to one another.

As shown in FIG. 2, the input terminal i of the selection circuit 5b of the block SRBn−1 is connected to a node On−2 (output of the block SRBn−2), and the input terminal j of the selection circuit 5b is connected to the node On (output of the block SRBn). Further, the output terminal X of the selection circuit 5b is connected to a node Sn−1 of the block SRBn−1. The input terminals p and q of the selection circuit 5b are connected to the LR line and the LRB line, respectively, and the RS-FF 3b has an INTB input connected to the INT line. Furthermore, the input terminal i of the selection circuit 5a of the block SRBn is connected to the node On−1 (output of the block SRBn−1), and the input terminal j of the selection circuit 5a is connected to the start pulse line SP via a switch SW17. Further, the output terminal X of the selection circuit 5a is connected to a node Sn of the block SRBn. The input terminals p and q of the selection circuit 5a are connected to the LR line and the LRB line, respectively. The RS-FF 3a has an INTB input connected to the INT line, and the conductive terminal T of the ASW 8a is connected to the CK (clock) 1 line.

Operation of the present shift register will be described below in view of the arrangement of the present shift register by using FIGS. 1 through 3.

Figure 3:
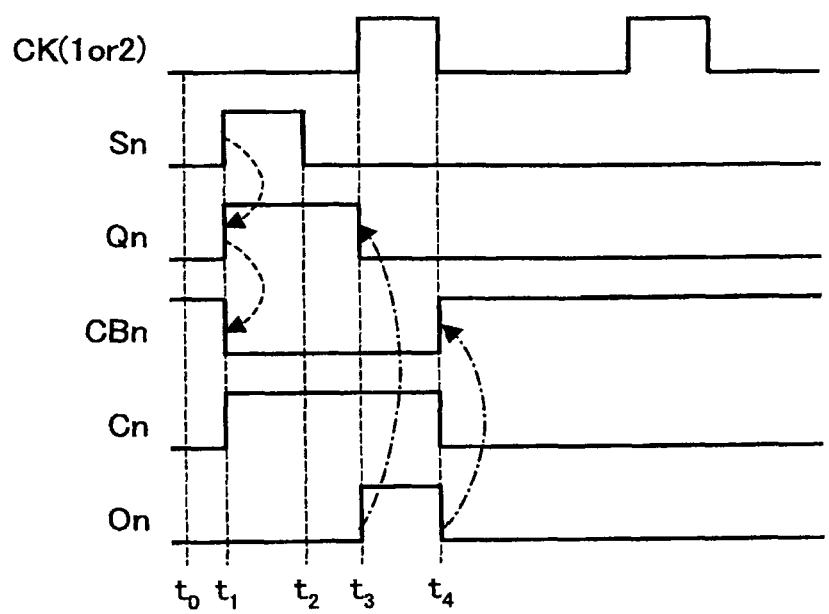
FIG. 3 is a timing chart showing operation of a single block of the present shift register.
Figure 12:
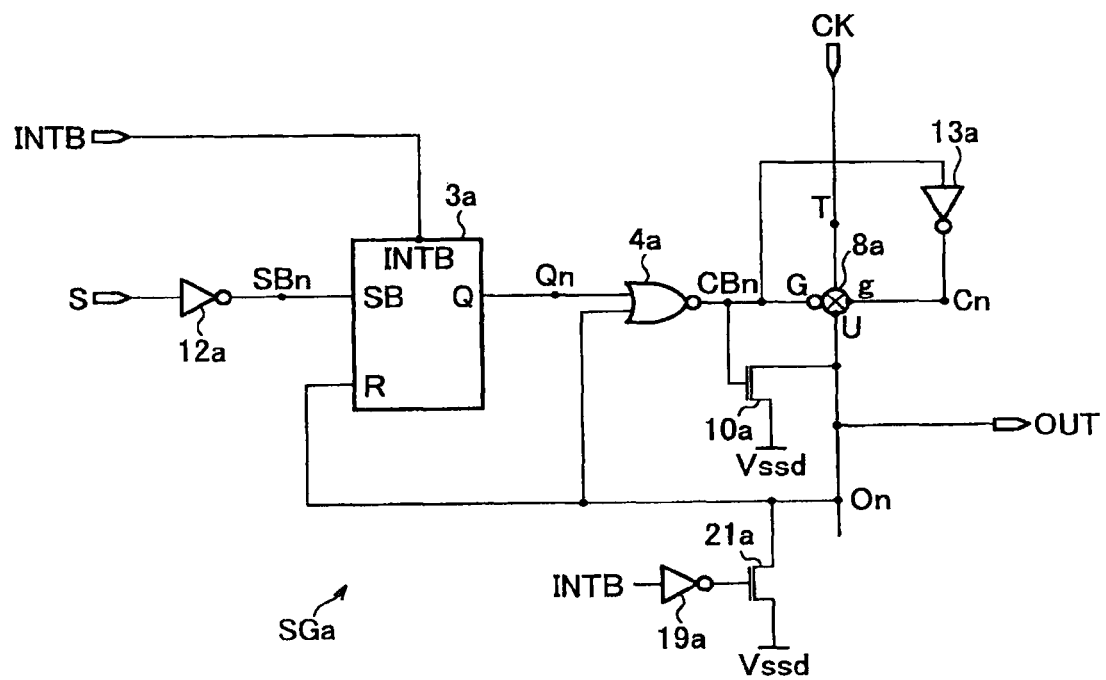
FIG. 12 is a circuit diagram showing a modified example of the signal output circuit of FIG. 1.
Figure 13:
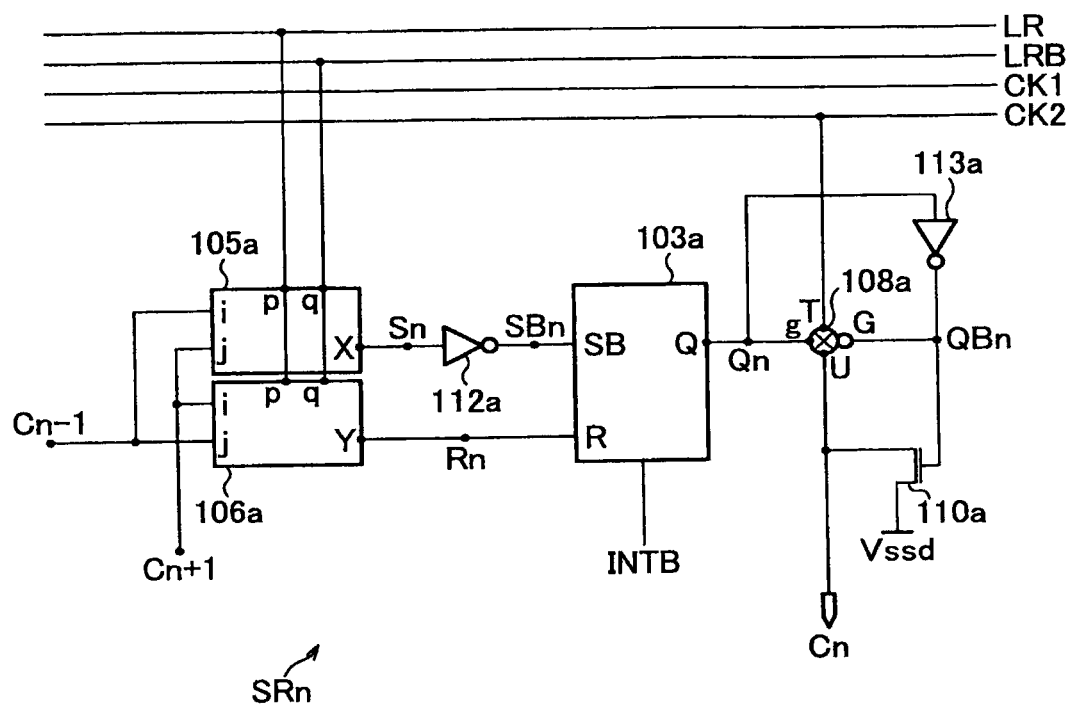
FIG. 13 is a circuit diagram showing a single block of a conventional shift register.
Figure 14:
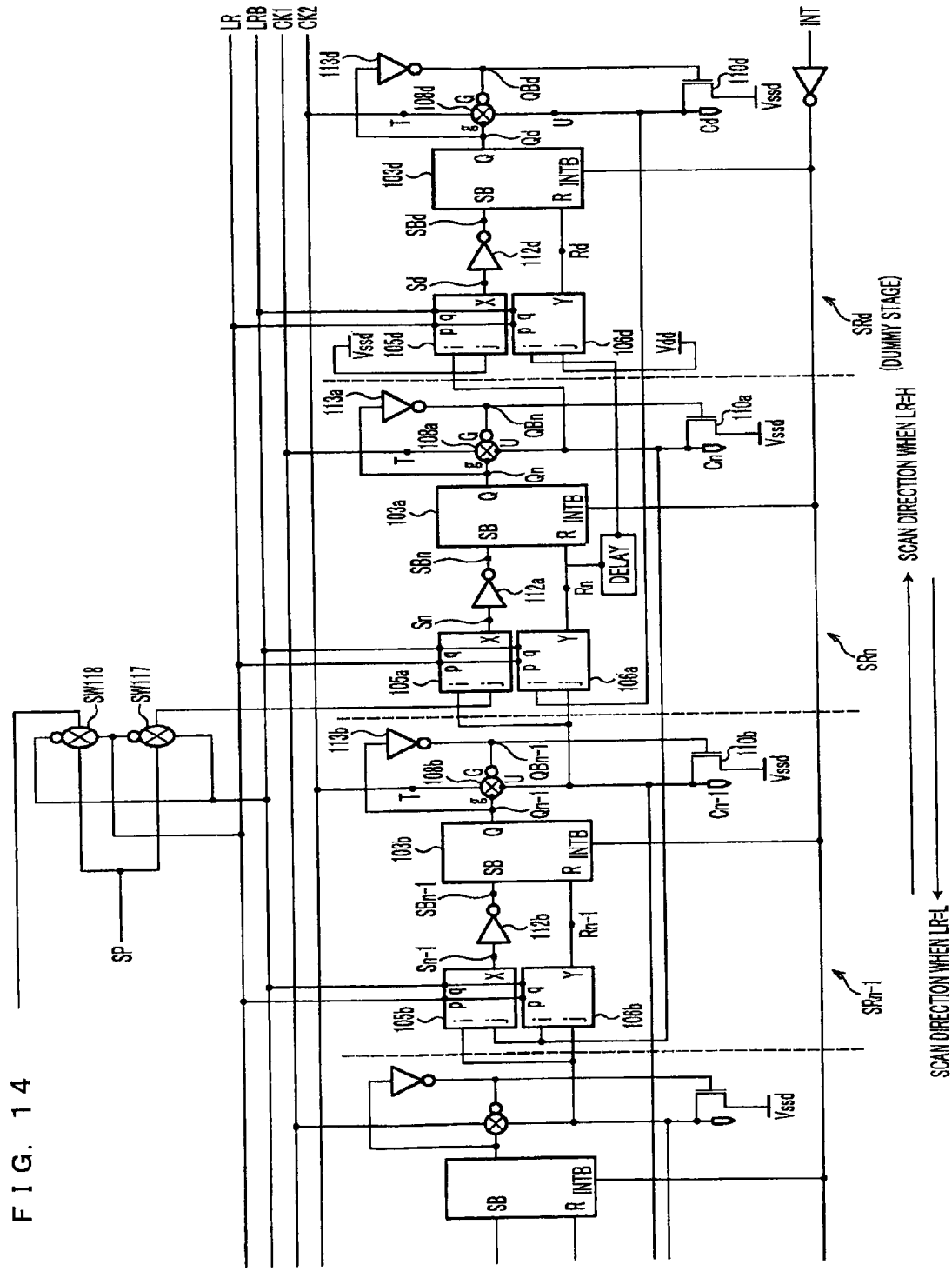
FIG. 14 is a circuit diagram showing an arrangement of the conventional shift register.
Figure 15:
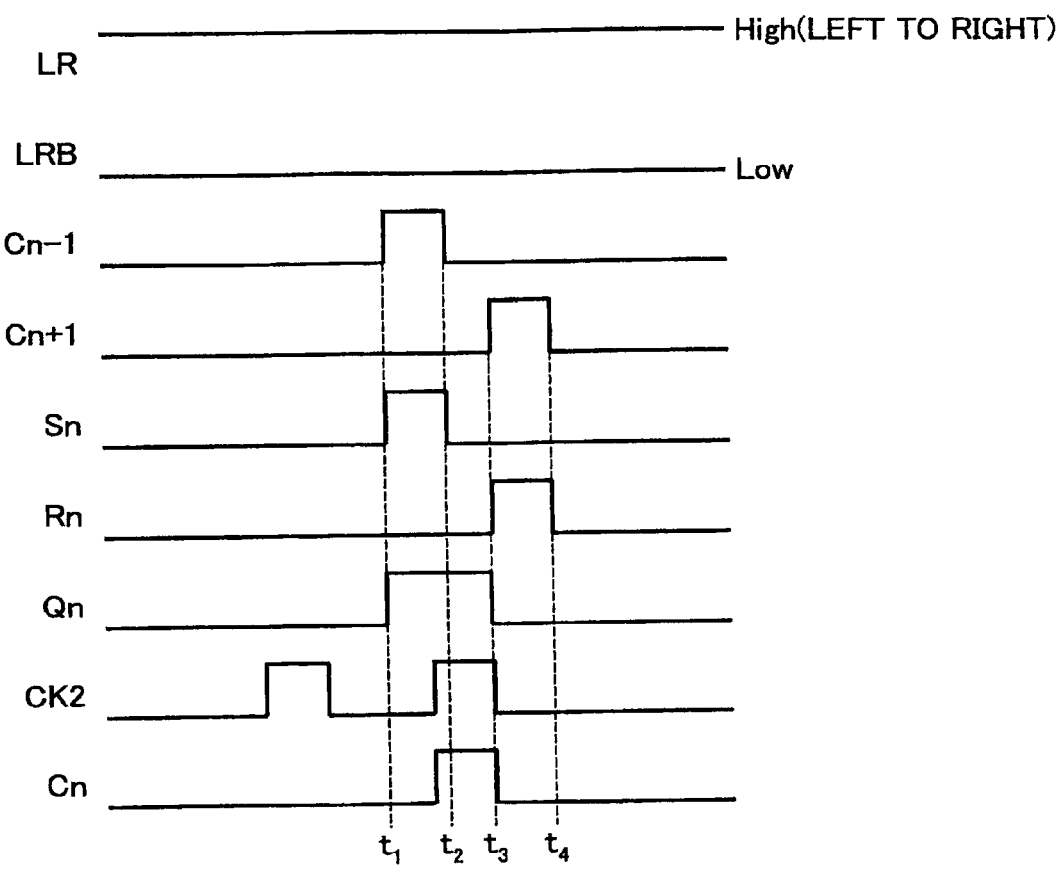
FIG. 15 is a timing chart showing operation of the single block of FIG. 13.
Figure 16:
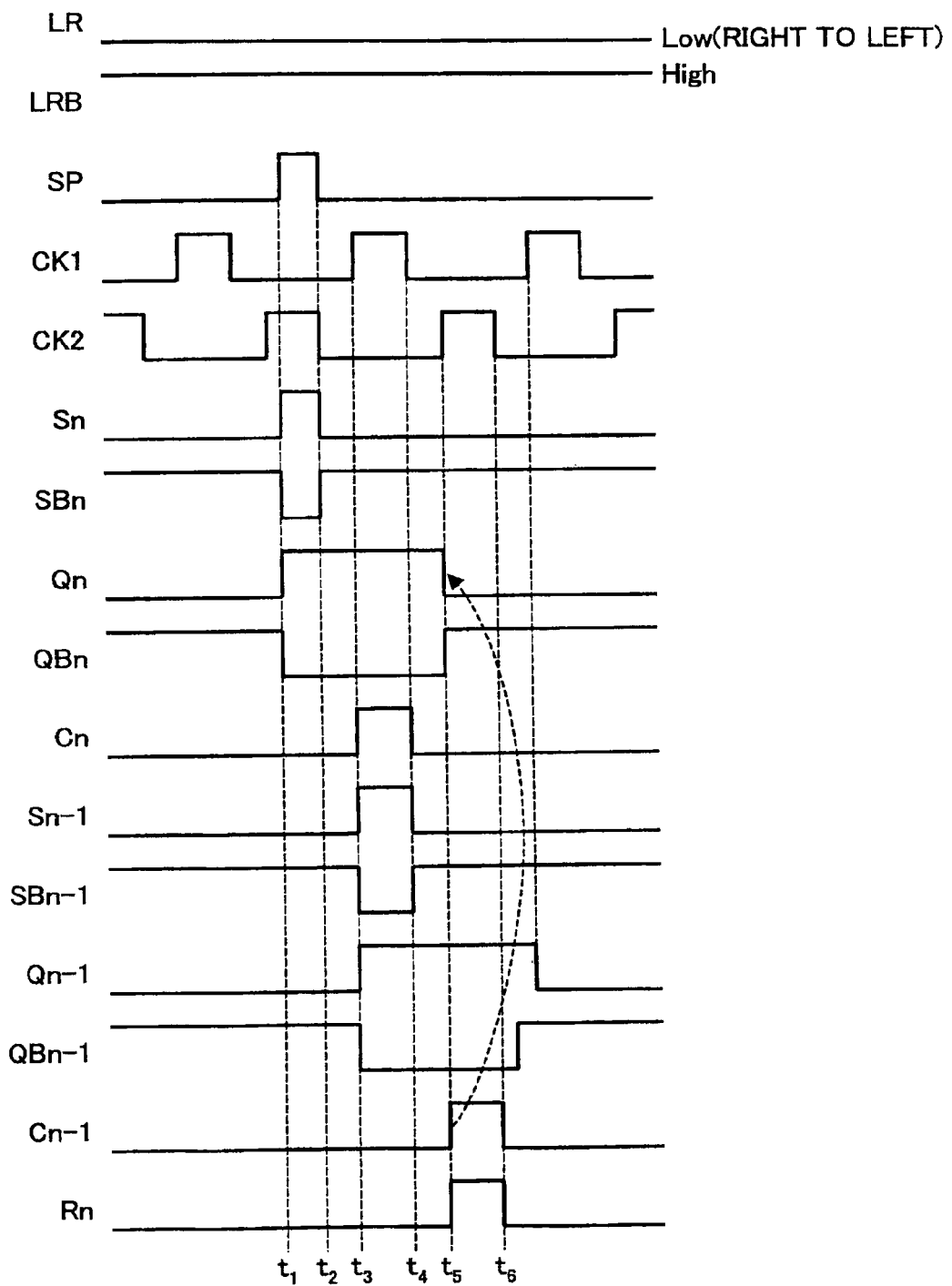
FIG. 16 is a timing chart showing operation (right to left) of the shift register of FIG. 14.
Figure 17:
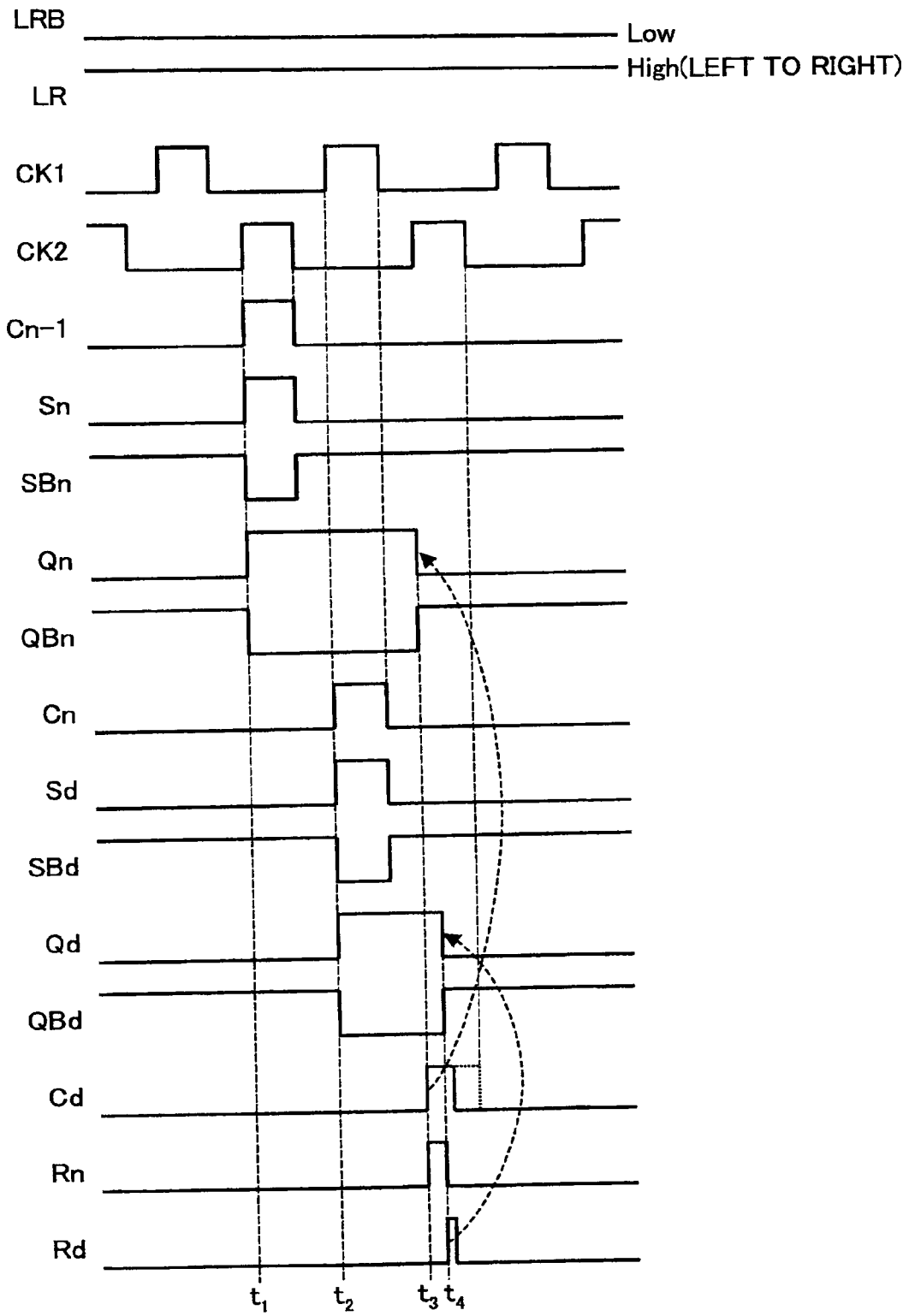
FIG. 17 is a timing chart showing operation (left to right) of the shift register of FIG. 14.

Although not shown in FIG. 3, the initial reset is performed regardless of the shift direction. That is, the INTB input of each of the RS-FFs is supplied with a low input by supplying the INT line with a high INT signal, so that the output Q of each of the RS-FFs becomes low. At this time, since the output O of each of the blocks SRB is normally low, the node CB becomes high and the node C becomes low, so that the conductive terminals T and U of each of the ASWs are disconnected from each other. Since the node CB is high, each of the MOS transistors 10 remains turned on, so that each of the outputs (On−2, On−1, On) is supplied with Vssd (low output signal). In this regard, when the output of the block SRB is high at the time of initialization for some reason, the node CB becomes low, so that the conductive terminals T and U of each of the ASWs undesirably become connected. In view of this, it is preferable that the initialization be performed when the clock signal CK is low. The signal output circuit can be arranged as in FIG. 12 so that the conductive terminals T and U of each of the ASWs can be surely disconnected from each other at the time of initialization. That is, in case of the signal output circuit SGa, the arrangement of FIG. 1 is further provided with an N-channel MOS transistor 21a whose gate is connected to the INTB via an inverter 19a, whose source is connected to Vssd, and whose drain is connected to the node On. This makes it possible that the node CB of each of the blocks SRB is surely made high at the time of initialization, so that the output O can be made Vssd (low) regardless of whether the clock signal CK is high or low.

The present shift register can make both a rightward shift and a leftward shift. That is, when the LR line and the LRB line are supplied with a high shift direction signal and a low shift direction signal, respectively, a rightward shift is made (i.e., a case where a shift starts from the block SRBn−1 and ends at the block SRBn). At this time, since the LR line is high and the LRB line is low, the input terminals of p and q of the selection circuit 5b are supplied with a high input and a low input, respectively, so that a signal that is inputted to the input terminal i is outputted from the output terminal X. Since the LR line is high and the LRB line is low, the start pulse signal switch SW17 is off and a switch SW18 is on (the shift starts from the left edge).

On the other hand, when the LR line and the LRB line are supplied with a low shift direction signal and a high shift direction signal, respectively, a leftward shift is made (a shift starts from the block SRBn and ends at the block SRB1). At this time, since the LR line is low and the LRB line is high, the input terminals p and q of the selection circuit 5b are supplied with a low input and a high input, respectively, so that a signal that is inputted to the input terminal j is outputted from the output terminal X. Since the LR line is low and the LRB line is high, the start pulse signal switch SW17 is on and the switch SW18 is off (the shift starts from the right edge).

Operation of the block SRBn of FIG. 2 and a method for making a shift to the neighbor block SRBn−1 will be described below with reference to FIGS. 2 and 3.

First, at t0 where the output On−1 of the block SRBn−1 is low, the input terminal i of the selection circuit 5a becomes low, so that the output terminal X (Sn) of the selection circuit 5a becomes low. As a result, the SB of the RS-FF 3a is supplied with a high input from the inverter 12a. Since the R (reset) of the RS-FF 3a is connected to the output On of the RS-FF 3a, the R (reset) of the RS-FF 3a remains low. With this, the output Q (Qn) of the RS-FF 3a remains as low as heretofore. At this time, the inputs of the NOR circuit 4a are supplied with low inputs from the output Q of the RS-FF 3a and the output On of the RS-FF 3a, respectively, so that the output (CBn) of the NOR circuit 4a becomes high. As a result, the control terminal g (Cn) becomes low and the control terminal G becomes high. That is, the ASW 8a is turned off, so that the conductive terminals T and U are disconnected from each other. Meanwhile, the gate (CBn) of the MOS transistor 10a becomes high, so that electricity is conducted between the source and drain of the MOS transistor 10a. The output On is supplied with Vssd (low output signal).

In cases where a rightward shift is made (i.e., in cases where the block SRBn serves as the last stage of the shift), the input terminal i the selection circuit 5a becomes high at t1 where the output On−1 of the block SRBn−1 becomes high, so that the output terminal X (Sn) of the selection circuit 5a becomes high. Alternatively, in cases where a leftward shift is made (i.e., in cases where the block SRBn serves as the first stage of the shift), the input terminal j of the selection circuit 5a become high at t1 where a high start pulse signal is inputted via the switch SW17, so that the output terminal X (Sn) of the selection circuit 5a becomes high.

As a result, the SB of the RS-FF 3a is supplied with a low input from the inverter 12a. At this time, the R (reset) of the RS-FF 3a remains low. With this, the output Q of the RS-FF 3a becomes high. At this time, the inputs of the NOR circuit 4a are supplied with a high input and a low input from the output Q of the RS-FF 3a and the output On of the RS-FF 3a, respectively, so that the output (CBn) of the NOR circuit 4a becomes low. As a result, the ASW 8a is turned on (the control terminal g becomes high and the control terminal G becomes low), so that the output On is supplied with a low output signal from the CK1 line via the conductive terminals T and U.

Then, at t2 where the output On−1 of the block SRBn−1 becomes low, the input terminal i of the selection circuit 5a become low, so that the output terminal X of the selection circuit 5a becomes low. As a result, the SB of the RS-FF 3a is supplied with a high input from the inverter 12a. Since the R (reset) of the RS-FF 3a is connected to the output On of the RS-FF 3a, the R (reset) of the RS-FF 3a remains low. With this, the output Q (Qn) of the RS-FF 3a remains as high as heretofore. At this time, the inputs of the NOR circuit 4a are supplied with a high input and a low input from the output Q of the RS-FF 3a and the output On of the RS-FF 3a, respectively, so that the output of the NOR circuit 4a becomes low. As a result, the ASW 8a remains turned on (the control terminal g remains high and the control terminal G remains low), so that the output On is supplied with a low output signal from the CK1 line.

The output On becomes high at t3 where the signal CK1 becomes high. Since the output terminal X of the selection circuit 5a remains low, the SB of the RS-FF 3a becomes high. Further, the R of the RS-FF 3a becomes high since it is connected to the output On. With this, the output Q of the RS-FF 3a becomes low. At this time, the inputs of the NOR circuit 4a are supplied with a low input and a high input from the output Q of the RS-FF 3a and the output On of the RS-FF 3a, respectively, the output (CBn) of the NOR circuit 4a remains low (the ASW 8a remains turned on), so that the output On is supplied with a high output signal from the CK1 line.

Then, the output On becomes low at t4 where the signal CK1 becomes low. Since the output terminal X of the selection circuit 5a also remains low, the SB of the RS-FF 3a becomes high. Further, the R of the SR-FF 3a becomes low since it is connected to the output On. With this, the output Q of the RS-FF 3a remains as low as heretofore. At this time, the inputs of the NOR circuits 4a are supplied with low inputs from the output Q of the SR-FF 3a and the output On of the RS-FF 3a, respectively, so that the output (CBn) of the NOR circuit 4a becomes high. As a result, whereas the ASW 8a is turned off (the control terminal g becomes low and the control terminal G becomes high), electricity is conducted between the source and drain of the MOS transistor 10a, so that the output On is supplied with Vssd (low output signal).

In cases where a leftward shift is made (i.e., in cases where the block SRBn serves as the first stage of the shift), the input terminal j of the selection circuit 5b of the block SRBn–1 is supplied with a high input at t3 where the output On becomes high. With this, the output terminal X (Sn–1) of the selection circuit 5a becomes high, so that a shift to the block SRBn–1 is made. Specifically, when the output terminal X (Sn–1) of the selection circuit 5b becomes high, the SBn–1 becomes low (active) and the Qn–1 becomes high (active). With this, one of the inputs of the NOR circuit 4a becomes high, and the output (CBn) of the NOR circuit 4a becomes low. As a result, the ASW 8b is turned on and the clock CK starts to be loaded, so that the output On–1 becomes low. When the clock CK becomes high and the output On–1 also becomes high, the Qn–1 is reset so as to be low (inactive). Meanwhile, since the output On–1 is high, the output CBn–1 of the NOR circuit 4b remains low, so that the clock CK continues to be loaded. Finally, when the clock CK becomes low and the output On–1 becomes low, the Qn–1 remains low, so that the output CBn–1 of the NOR circuit 4b also becomes high (inactive). With this, the ASW 8b is turned off and the transistor 10b is turned on, so that the output On–1 remains low.

The signal output circuit SGb (see FIG. 18) of the block SRBn–1 and the signal output circuit SGc (see FIG. 19) of the block SRBn–2 operate in the same manner as the signal output circuit SGa (see FIG. 1) of the block SRBn. That is, On–1 and On–2 correspond to On. Qn–1 and Qn–2 correspond to Qn. CBn–1 and CBn–2 correspond to CBn. Further, the signal output circuits SG may receive clock signals having identical or different phases. The following shows, with reference to the timing chart of FIG. 20, how the signal output circuit SGa (block SRBn) and the signal output circuit SGb (block SRBn–1) operate in cases where the signal output circuits SGa and SGb receive clock signals CK (CK1 and CK2) having different phases.

As described above, each stage of the shift register according to the present embodiment does not receive a reset signal from another stage, and resets itself (self-reset) with use of a signal generated thereby. This makes it possible to eliminate such a dummy block as required by the conventional technique. In addition, since each stage does not need to receive a reset signal from another stage, it is possible to significantly reduce the number of wires provided between the stages, and to reduce the wiring region. This results in a reduction in the area of the circuit (or a reduction in the area of a frame of a panel in which the circuit is mounted). Furthermore, it is possible to reduce signal defects such as a signal delay as well as physical failures such as a wiring short. The present embodiment is also effective when the clock signal to be shifted has a duty ratio of not more than 50%.

The present shift register can also be provided in the gate driver 78 of FIG. 21.

Figure 9:
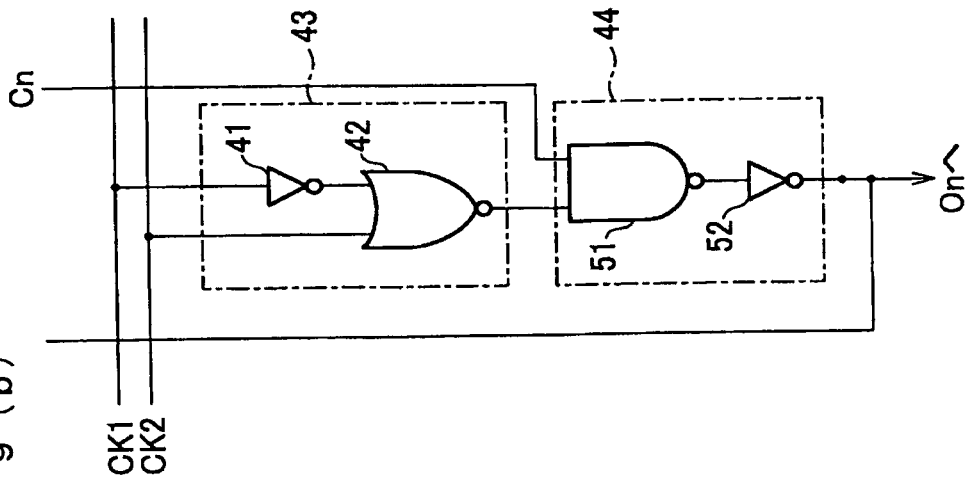
FIG. 9(a) is a circuit diagram showing a modified example of the signal output circuit that is provided in the present shift register.
FIG. 9(b) is a circuit diagram showing a modified example of the signal output circuit that is provided in the present shift register.
Figure 9:
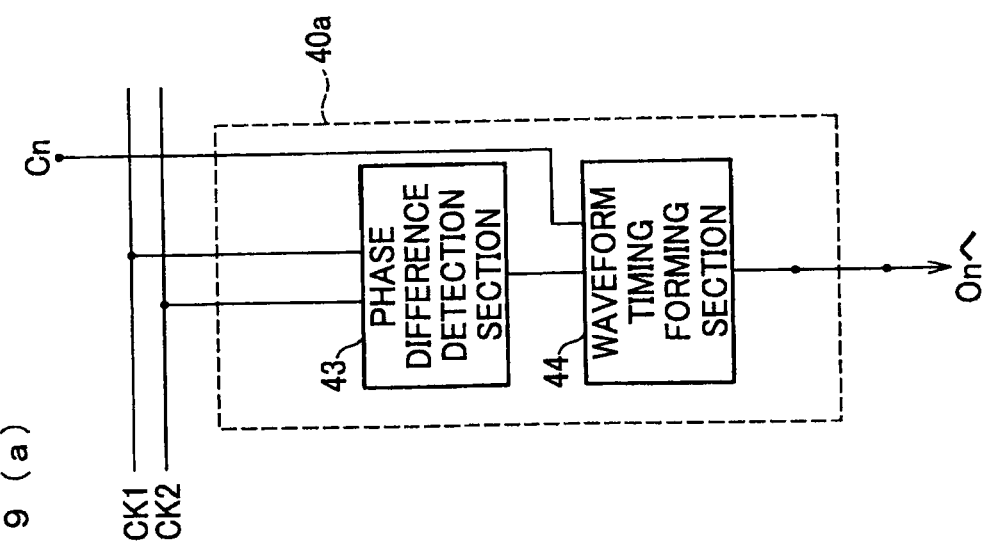

The signal output circuit of FIG. 1 may be modified so as to be arranged as shown in FIG. 9(a). That is, the ASW 8a is replaced by a malfunction prevention circuit 40a. The malfunction prevention circuit 40a prevents the shift register from malfunctioning even in a period during which a phase lag between the clock signals CK1 and CK2 causes the clock signals CK1 and CK2 to have overlapping waveforms, i.e., to be both high. The malfunction prevention circuit 40a includes a phase difference detection section 43 and a waveform timing forming section 44.

The phase difference detection section 43 detects the respective waveforms of the clock signals CK1 and CK2, extracts such a waveform that the clock signals CK1 and CK2 do not overlap, and generates a new clock signal (overlap eliminating clock signal) from the waveform thus extracted. Such a phase difference detection section 43 can be constituted by a NOR circuit 42 and an inverter circuit 41, for example, as shown in FIG. 9(b).

Meanwhile, the waveform timing forming section 44, connected to the node Cn, generates an output signal by extracting, in a period during which a signal Cn of the node Cn is high, a period during which the new clock signal generated by the corresponding phase difference detection section 43 is high, and then outputs the output signal as a signal On. Such a waveform timing forming section 44 can be constituted by a NAND circuit 51 and an inverter circuit 52, for example, as shown in FIG. 9(b).

Figure 4:
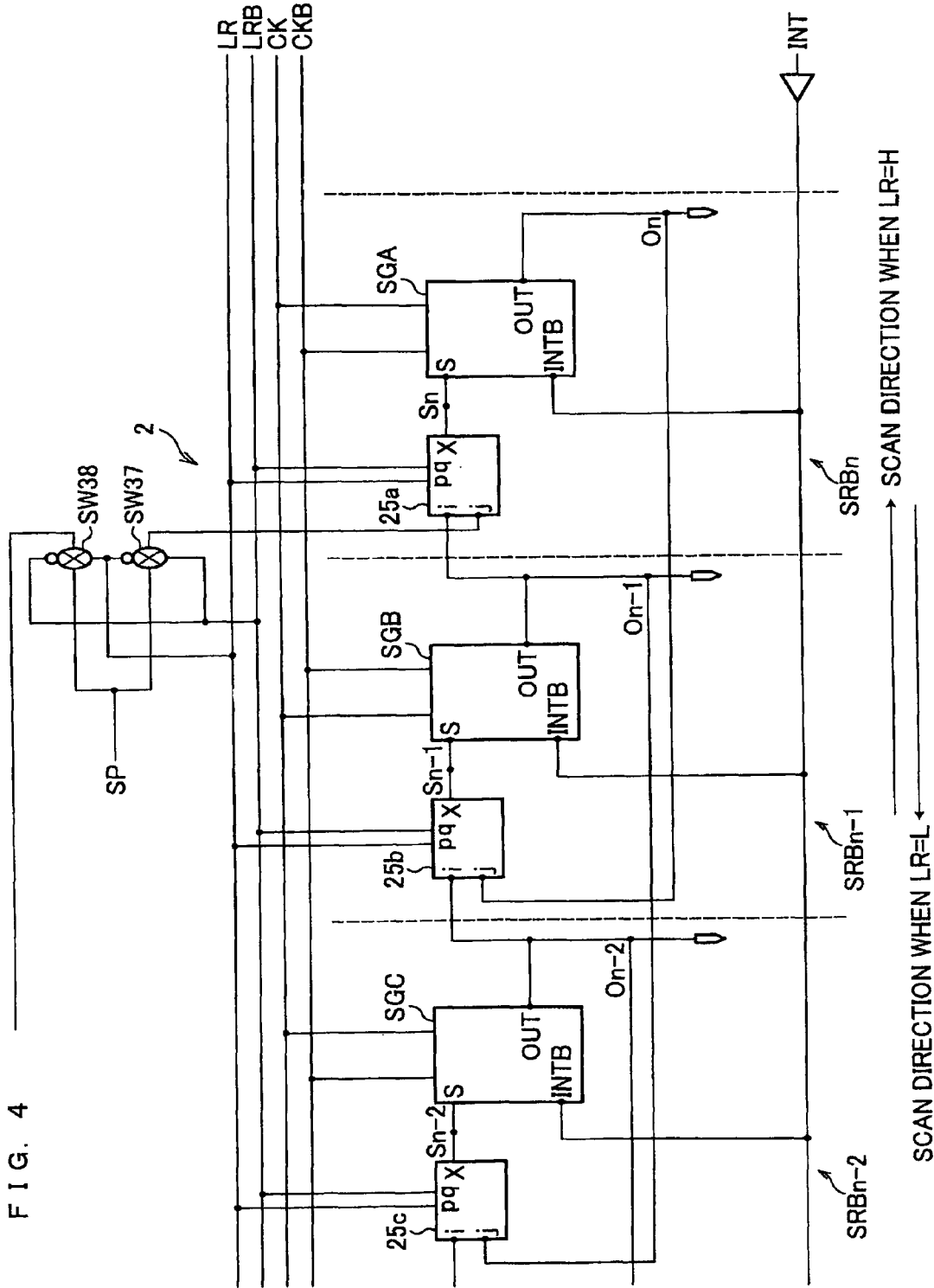
FIG. 4 is a circuit diagram showing another arrangement of the present shift register.

FIG. 4 shows an arrangement of a shift register according to another embodiment of the present invention. As shown in FIG. 4, the present shift register 2 includes blocks SRB1 through SRBn–2, SRBn–1, and SRBn, each of which includes a signal output circuit SG and a selection circuit 25.

The block SRBn has a signal output circuit SGA and a selection circuit 25a. The signal output circuit SGA includes an RS flip-flop (hereinafter referred to as "RS-FF") 23a, a level shifter LSa, a NOR circuit 24a, and two inverters 32a and 33a. Similarly, the block SRBn–1 has a signal output circuit SGB and a selection circuit 25b. The signal output circuit SGB includes an RS flip-flop (hereinafter referred to as "RS-FF") 23b, a level shifter LSb, a NOR circuit 24b, and two inverters 32b and 33b. Similarly, the block SRBn–2 has a signal output circuit SGC and a selection circuit 25c. The signal output circuit SGB includes an RS flip-flop (hereinafter referred to as "RS-FF") 23c, a level shifter LSc, a NOR circuit 24c, and two inverters 32c and 33c.

The LR line is supplied with a shift direction signal, and the LRB line is supplied with an inversion signal obtained by inverting the shift direction signal. The CK1 line is supplied with a first clock signal, and the CK2 line is supplied with a second clock signal.

Figure 6:
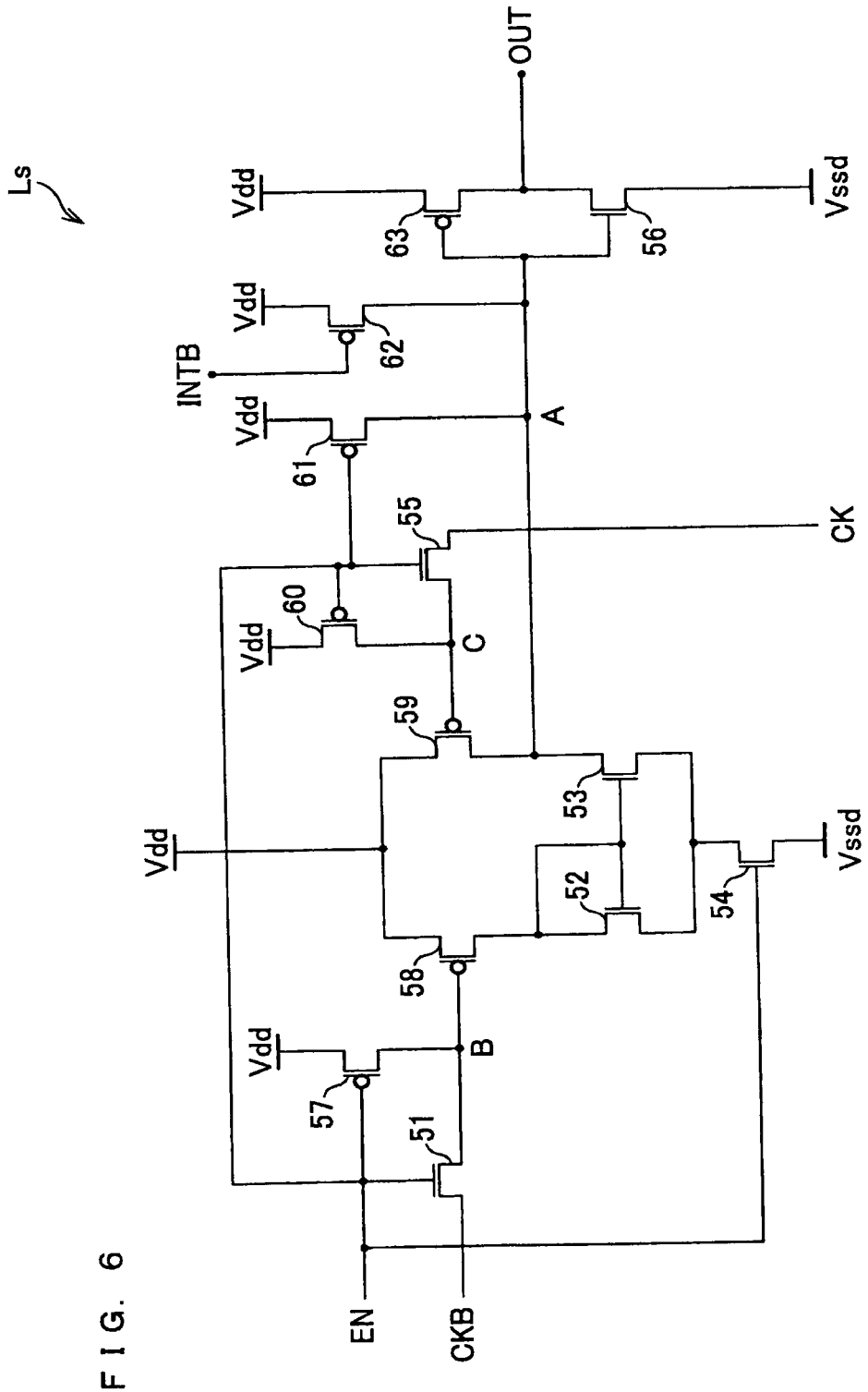
FIG. 6 is a circuit diagram showing an arrangement of a level shifter for use in the signal output circuit of FIG. 5.

Each of the level shifters LS (LSa, LSb, LSc) is arranged as shown in FIG. 6. That is, the level shifter LS includes N-channel MOS transistors 51 to 56 and P-channel MOS transistors 57 to 63. It should be noted here that an input (EN terminal), a gate of the transistor 51, a gate of the transistor 57, a gate of the transistor 55, a gate of the transistor 61, and a gate of the transistor 60 are connected to one another. Further, a source of the transistor 51 is connected to CKB, and a drain of the transistor 51, a drain of the transistor 57, a gate of the transistor 58, and a node B are connected to one another. Further, a drain of the transistor 58, a drain of the transistor 52, a gate of the transistor 52, and a gate of the transistor 53 are connected to one another. A source of the transistor 52, a drain of the transistor 54, and a source of the transistor 53 are connected to one another. Further, a drain of the transistor 53, a node A, a drain of the transistor 59, a drain of the transistor 61, a drain of the transistor 62, a gate of the transistor 63, and a gate of the transistor 56 are connected to one another. Further, a source of the transistor 57, a source of the transistor 60, a source of the transistor 61, a source of the transistor 62, and a source of the transistor 63 are connected to Vdd (high). Further, a source of the transistor 54 and a source of the transistor 56 are connected to Vssd (low). Further, a source of the transistor 58 and a source of the transistor 59 are connected to each other so as to be connected to Vdd (high). Further, a gate of the transistor 59, a node C, a drain of the transistor 60, and a drain of the transistor 55 are connected to one another. Further, a source of the transistor 55 is connected to CK, and a gate of the transistor 62 is connected to INTB. A drain of the transistor 63, a drain of the transistor 56, and OUT are connected to one another.

The selection circuit 25 (25a, 25b, 25c) is identical in arrangement and function to the selection circuit 5. Further, the inverter 32 (32a, 32b, 32c) and the inverter 33 (33a, 33b, 33c) are identical to the inverters 12 and 13.

FIG. 5 shows a specific arrangement of the signal output circuit SGA provided in the block SRBn. As shown in FIG. 5, a node Sn connected to an X terminal of the selection circuit 25a and an input side of the inverter 32a are connected to each other, and an output of the inverter 32a is inputted to a set bar (SB) of the RS-FF 23a. Further, an output Q (Qn) of the RS-FF 23a is inputted to one input of the NOR circuit 24a, and the other input of the NOR circuit 24a, a reset input (R) of the RS-FF 23a, and a node On (output of the block SRBn) connected to OUT of the level shifter LSa are connected to one another. Further, an output of the NOR circuit 24a is connected to an input side of the inverter 33a, and an output side of the inverter 33a is connected to an input (EN terminal) of the level shifter LSa.

It should be noted that the signal output circuits SGB and SGC are arranged in the same manner as the signal output circuit SGA. For example, as for the signal output circuit SGB, a node Sn−1 connected to an X terminal of the selection circuit 25b and an input side of the inverter 32b are connected to each other, and an output of the inverter 32b is inputted to a set bar (SB) of the RS-FF 23b. Further, an output (Q) of the RS-FF 23b is inputted to one input of the NOR circuit 24b, and the other input of the NOR circuit 24b, a reset input (R) of the RS-FF 23b, and a node On−1 (output of the block SRBn−1) connected to OUT of the level shifter LSb are connected to one another. Further, an output of the NOR circuit 24b is connected to an input side of the inverter 33b, and an output side of the inverter 33b is connected to an input (EN terminal) of the level shifter LSb.

As shown in FIG. 4, the selection circuit 25b of the block SRBn−1 has an input terminal i connected to a node On−2 (output of the block SRBn−2), and has an input terminal j connected to the node On (output of the block SRBn). Further, the selection circuit 25b has an output terminal X connected to a node Sn−1 of the block SRBn−1. The selection circuit 25b has input terminals p and q respectively connected to the LR line and the LRB line, and the level shifter LSn−1 has an INTB input, a CK input, and a CKB input respectively connected to the INT line, the CK line, and the CKB line.

Furthermore, the selection circuit 25a of the block SRBn has an input terminal i connected to the node On−1 (output of the block SRBn−1), and has an input terminal j connected to a start pulse line SP via a switch SW37. Further, the selection circuit 25a has an output terminal X connected to a node Sn of the block SRBn. The selection circuit 25a has input terminals p and q respectively connected to the LR line and the LRB line, and the level shifter LSn has an INTB input, a CK input, and a CKB input respectively connected to the INT line, the CK line, and the CKB line.

Figure 7:
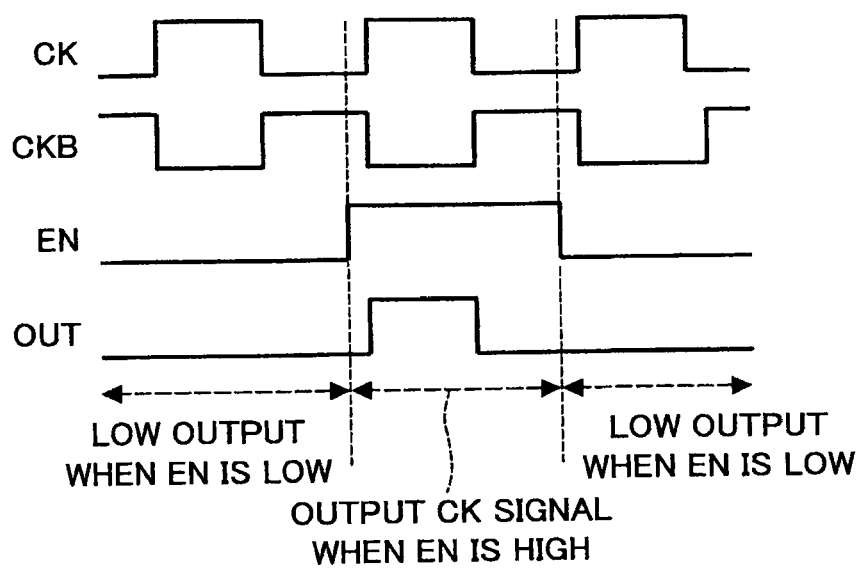
FIG. 7 is a timing chart showing operation of the level shifter of FIG. 6.

The level shifter LS (LSa, LSb) of FIG. 6 operates as shown in FIG. 7. That is, when the EN terminal receives a high input, the level shifter LS outputs a CK signal whose level has been shifted. When the EN terminal receives a low input, the level shifter LS produces a low output. When the INTB input receives a low input, the level shifter LS produces a low output.

In cases where the EN terminal is low, the P-channel transistors 57, 60, and 61 of FIG. 6 are turned on, whereas the N-channel transistors 54, 51, and 55 of FIG. 6 are turned off. As a result, the potential of the node A becomes Vdd (high), and the potential of the output OUT becomes Vssd (low).

In cases where the EN terminal is high, the P-channel transistors 57, 60, and 61 of FIG. 6 are turned off, whereas the N-channel transistors 54, 51, and 55 of FIG. 6 are turned on. As a result, the node B has the potential of the CKB input, and the node C has the potential of the CK input.

In cases where the CKB input is high and the CK input is low, the current of the P-channel transistor 58 is limited. Then, the P-channel transistor 59 is turned on, so that a current flows through the transistor 59. Therefore, the potential of the node A is increased. This causes the output OUT to become Vssd (low).

On the other hand, in cases where the CKB input is low and the CK input is high, the current of the transistor 58 is not limited since the transistor 58 is on. Further, the current of the P-channel transistor 59 is limited. Therefore, the potential of the node A is decreased. This causes the output OUT to become Vdd (high).

With this, the signal output circuit SGA (see FIG. 5) operates in the following manner.

When the node Sn is supplied with a high input, the SB of the RS-FF 23a is supplied with a low input. With this, the output Q (Qn) becomes high. It should be noted here that the signal Qn, the signal On of the node On (output of the block SRBn), a signal NORn serving as the NOR (output of the NOR circuit 24a) of the signal Qn and of the signal On, and the output Cn (inversion signal obtained by inverting the signal NORn) of the inverter 33a are related to one another in the following manner.

That is, in cases where the signal Qn and the signal On are low, the signal NORn is high and the output Cn is low. In cases where the signal Qn is low and the signal On is high, the signal NORn is low and the output Cn is high. In cases where the signal Qn is high and the signal On is low, the signal NORn is low and the output Cn is high. In cases where the signal Qn and the signal On are high, the signal NORn is low and the output Cn is high.

Figure 8:
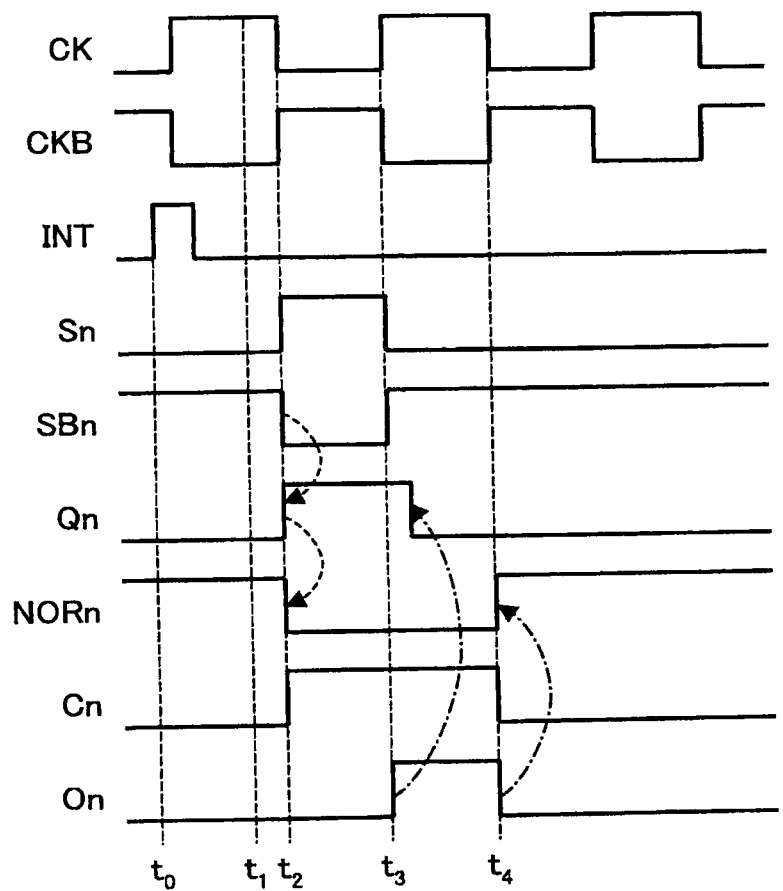
FIG. 8 is a timing chart showing operation of a single block of the shift register of FIG. 4.

Operation of the block SRBn (see FIG. 4) will be described below with reference to the timing chart of FIG. 8.

First, at t0 where the default setting is configured so that a high INT signal is inputted, the output signal Qn of the RS-FF 23a and the output signal On of the level shifter LS are low (initialization).

At t1 where the output signals Qn and On are low, the signal NORn is high and the output Cn is low. Since the output Cn is inputted as a signal EN to the level shifter LSn, the signal EN becomes low. Therefore, the output signal On is low regardless of whether the CK and CKB inputs are high or low.

At t2 where the output Sn becomes high, the SB of the RS-FF 23a is supplied with a low input, so that the output signal Qn becomes high. Therefore, the output signal Qn is high and the output signal On is low, so that the signal NORn becomes low and the output Cn becomes high. The EN terminal of the level shifter LSn becomes high when the output Cn is high. Moreover, in cases where the EN terminal is high, the CK signal is outputted as the output signal On. That is, in cases where the CK input is low and the CKB input is high, the output signal On becomes low. Of course, the output signal On becomes high when the CK input is high and the CKB input is low.

The node On is connected to the reset (R) of the RS-FF 23a. Therefore, when the R (reset) of the RS-FF 23a is supplied with a high input at t3 where the output signal On becomes high, the output signal Qn becomes low. Since the output signal On is high, the signal NORn is low and the output Cn is high. Since the output Cn is high, the EN terminal of the level shifter LS remains high (continues to be supplied with the CK input).

Therefore, at t4 where the CK input becomes low (the CKB input becomes high), the output signal On becomes low in accordance with the CK input. At this time, the output signal Qn is low and the output signal On becomes low, so that the signal NORn becomes high and the output Cn becomes low. Therefore, the EN terminal of the level shift LSn becomes high, so that the output signal On becomes low regardless of whether the CK and CKB inputs are high or low.

Thus, the present shift register can reset itself by using a signal of its own without requiring a signal of another stage. This makes it possible to eliminate such a dummy circuit as required by the conventional technique. In addition, since the present shift register does not need to receive a reset signal from another stage, it is possible to significantly reduce the number of wires provided between the stages, and to reduce the wiring region. This results in a reduction in the area of the circuit (or a reduction in the area of a frame of a panel in which the circuit is mounted). Furthermore, it is possible to reduce signal defects such as a signal delay as well as physical failures such a wiring short.

Furthermore, the signals Oi (i=1, 2 ... n−1, n) and the signals Ci (i=1, 2 ... n−1, n) can be used respectively as single pulse signals and double pulse signals to control charging of bus lines (data signal lines and scanning signal lines). Further, the signals Qi (i=1, 2 ... n−1, n) can be used as signals to control charging of the bus lines.

INDUSTRIAL APPLICABILITY

A signal output circuit of the present invention can be applied to a circuit (shift register) for driving a display device such as a liquid crystal display device.

The invention claimed is:

1. A signal output circuit that is provided in a unit stage of a shift register, comprising:
    a set-reset flip-flop including a reset input terminal and a set input terminal;
    a logic circuit; and
    an analog switch,
    the analog switch including an input terminal connected to a line via which a clock signal is supplied,
    the logic circuit including a first input terminal connected to an output terminal of the flip-flop and a second input terminal connected to an output terminal of the signal output circuit,
    the logic circuit including an output terminal connected to a control terminal of the analog switch, and
    the reset input terminal being connected to the output terminal of the signal output circuit,
    wherein:
    an output of the flip-flop is (A) active when an input to the set input terminal is active, and (B) inactive when an input to the reset input terminal is active;
    an output of the logic circuit is (a) inactive when the output of the flip-flop and an output of the signal output circuit are inactive, and (b) active when at least one of the output of the flip-flop and the output of the signal output circuit is active; and
    the analog switch (i) brings in the clock signal from its input terminal when the output of the logic circuit is active, and (ii) blocks off the clock signal when the output of the logic circuit is inactive.

2. The signal output circuit as set forth in claim 1, wherein: the signal output circuit is provided in a shift register of a circuit for driving a display device, the display device being driven with use of the output of the signal output circuit.

3. A shift register comprising a signal output circuit as set forth in claim 1.

4. The shift register as set forth in claim 3, wherein the signal output circuit is provided in at least either a first stage or a last stage.

5. The shift register as set forth in claim 3, further comprising, in each stage, a selection circuit for determining a shift direction, wherein
    the shift register is capable of making shifts in two directions.

6. A display device driving circuit comprising a shift register as set forth in claim 3.

7. A display device comprising a display device driving circuit as set forth in claim 6.

8. A signal output circuit that is provided in a unit stage of a shift register, comprising:
    a set-reset flip-flop including a reset input terminal and a set input terminal;
    a logic circuit; and
    a level shifter,
    the level shifter including an input terminal connected to a line via which a clock signal is supplied,
    the logic circuit including a first input terminal connected to an output terminal of the flip-flop and a second input terminal connected to an output terminal of the signal output circuit,
    the logic circuit including an output terminal connected to a control terminal of the level shifter, and
    the reset input terminal being connected to the output terminal of the signal output circuit,
    wherein:
    an output of the flip-flop is (A) active when an input to the set input terminal is active, and (B) inactive when an input to the reset input terminal is active;
    an output of the logic circuit is (a) inactive when the output of the flip-flop and an output of the signal output circuit are inactive, and (b) active when at least one of the output of the flip-flop and the output of the signal output circuit is active; and
    the level shifter (i) brings in the clock signal from its input terminal when the output of the logic circuit is active, and (ii) blocks off the clock signal when the output of the logic circuit is inactive.

9. The signal output circuit as set forth in claim 8, wherein: the signal output circuit is provided in a shift register of a circuit for driving a display device, the display device being driven with use of the output of the signal output circuit.

10. A shift register comprising a signal output circuit as set forth in claim 8.

11. The shift register as set forth in claim 10, wherein the signal output circuit is provided in at least either a first stage or a last stage.

12. The shift register as set forth in claim 10, further comprising, in each stage, a selection circuit for determining a shift direction, wherein
    the shift register is capable of making shifts in two directions.

13. A display device driving circuit comprising a shift register as set forth in claim 10.

14. A display device comprising a display device driving circuit as set forth in claim 13.

* * * * *